(12) United States Patent
Melanson

(10) Patent No.: US 7,894,216 B2
(45) Date of Patent: Feb. 22, 2011

(54) SWITCHING POWER CONVERTER WITH EFFICIENT SWITCHING CONTROL SIGNAL PERIOD GENERATION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 462 days.

(21) Appl. No.: 12/114,147

(22) Filed: May 2, 2008

(65) Prior Publication Data

US 2008/0273356 A1 Nov. 6, 2008

Related U.S. Application Data

(60) Provisional application No. 60/915,547, filed on May 2, 2007.

(51) Int. Cl.
*H02M 3/335* (2006.01)

(52) U.S. Cl. .................. 363/21.13; 363/89; 323/222

(58) Field of Classification Search ............ 363/16, 363/17, 19, 21.01, 21.08, 21.13, 21.11, 21.12, 363/89, 97, 39; 323/222, 282–286, 299, 323/272, 274, 224, 226; 315/297; 341/143, 341/144, 155

See application file for complete search history.

(56) References Cited

U.S. PATENT DOCUMENTS

| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |

(Continued)

FOREIGN PATENT DOCUMENTS

EP     0585789 A1    3/1994

(Continued)

OTHER PUBLICATIONS

Prodic et al., Dead-Zone Digital Controller for Improved Dynamic Response of Power Factor Preregulators, APEC 2003, 18th Annual IEEE Applied Power Electronics Conference and Exposition, Miami Beach FL, Feb. 9-13, 2003.

(Continued)

*Primary Examiner*—Rajnikant B Patel
(74) *Attorney, Agent, or Firm*—Hamilton & Terrile, LLP; Kent B. Chambers

(57) ABSTRACT

A power control system includes a switching power converter and a controller, and the controller responds to a time-varying voltage source signal by generating a switch control signal having a period that varies in accordance with at least one of the following: (i) the period of the switch control signal trends inversely to estimated power delivered to a load coupled to the switching power converter, (ii) the period of the switch control signal trends inversely to instantaneous voltage levels of the voltage source signal, and (iii) the period of the switch control signal trends directly with a line voltage level of the time-varying voltage source signal. In at least one embodiment, the controller achieves an efficient correlation between the switching period with associated switching losses and the instantaneous power transferred to the switching power converter while providing power factor correction (PFC).

26 Claims, 18 Drawing Sheets

U.S. PATENT DOCUMENTS

| | | | |
|---|---|---|---|
| 4,075,701 A | 2/1978 | Hofmann | |
| 4,334,250 A | 6/1982 | Theus | |
| 4,414,493 A | 11/1983 | Henrich | |
| 4,476,706 A | 10/1984 | Hadden et al. | |
| 4,677,366 A | 6/1987 | Wilkinson et al. | |
| 4,683,529 A | 7/1987 | Bucher | |
| 4,700,188 A | 10/1987 | James | |
| 4,737,658 A | 4/1988 | Kronmuller et al. | |
| 4,797,633 A | 1/1989 | Humphrey | |
| 4,940,929 A | 7/1990 | Williams | |
| 4,973,919 A | 11/1990 | Allfather | |
| 4,979,087 A | 12/1990 | Sellwood et al. | |
| 4,992,919 A | 2/1991 | Lee et al. | |
| 4,994,952 A | 2/1991 | Silva et al. | |
| 5,001,620 A * | 3/1991 | Smith | 363/89 |
| 5,109,185 A * | 4/1992 | Ball | 323/207 |
| 5,206,540 A | 4/1993 | de Sa e Silva et al. | |
| 5,264,780 A * | 11/1993 | Bruer et al. | 323/222 |
| 5,278,490 A | 1/1994 | Smedley | |
| 5,323,157 A | 6/1994 | Ledzius et al. | |
| 5,359,180 A | 10/1994 | Park et al. | |
| 5,383,109 A | 1/1995 | Maksimovic et al. | |
| 5,477,481 A | 12/1995 | Kerth | |
| 5,481,178 A | 1/1996 | Wilcox et al. | |
| 5,565,761 A | 10/1996 | Hwang | |
| 5,638,265 A | 6/1997 | Gabor | |
| 5,691,890 A | 11/1997 | Hyde | |
| 5,747,977 A | 5/1998 | Hwang | |
| 5,764,039 A | 6/1998 | Choi et al. | |
| 5,781,040 A | 7/1998 | Myers | |
| 5,783,909 A | 7/1998 | Hochstein | |
| 5,900,683 A | 5/1999 | Rinehart et al. | |
| 5,929,400 A | 7/1999 | Colby et al. | |
| 5,946,202 A | 8/1999 | Balogh | |
| 5,952,849 A | 9/1999 | Haigh et al. | |
| 5,960,207 A | 9/1999 | Brown | |
| 5,963,086 A | 10/1999 | Hall | |
| 5,966,297 A | 10/1999 | Minegishi | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,211,626 B1 | 4/2001 | Lys et al. | |
| 6,211,627 B1 | 4/2001 | Callahan | |
| 6,229,271 B1 | 5/2001 | Liu | |
| 6,246,183 B1 | 6/2001 | Buonavita | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,343,026 B1 * | 1/2002 | Perry | 363/65 |
| 6,344,811 B1 | 2/2002 | Melanson | |
| 6,385,063 B1 | 5/2002 | Sadek et al. | |
| 6,407,691 B1 | 6/2002 | Yu | |
| 6,441,558 B1 | 8/2002 | Muthu et al. | |
| 6,445,600 B2 | 9/2002 | Ben-Yaakov | |
| 6,452,521 B1 | 9/2002 | Wang | |
| 6,495,964 B1 | 12/2002 | Muthu et al. | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,636,003 B2 | 10/2003 | Rahm et al. | |
| 6,688,753 B2 | 2/2004 | Calon et al. | |
| 6,713,974 B2 | 3/2004 | Patchornik et al. | |
| 6,727,832 B1 | 4/2004 | Melanson | |
| 6,741,123 B1 | 5/2004 | Anderson et al. | |
| 6,753,661 B2 | 6/2004 | Muthu et al. | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,873,065 B2 | 3/2005 | Haigh et al. | |
| 6,882,552 B2 | 4/2005 | Telefus et al. | |
| 6,888,322 B2 | 5/2005 | Dowling et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 * | 9/2005 | Shteynberg et al. | 363/21.13 |
| 6,956,750 B1 | 10/2005 | Eason et al. | |
| 6,958,920 B2 | 10/2005 | Mednik et al. | |
| 6,967,448 B2 | 11/2005 | Morgan et al. | |
| 6,970,503 B1 | 11/2005 | Kalb | |
| 6,975,079 B2 | 12/2005 | Lys et al. | |
| 7,003,023 B2 | 2/2006 | Krone et al. | |
| 7,050,509 B2 | 5/2006 | Krone et al. | |
| 7,064,498 B2 | 6/2006 | Dowling et al. | |
| 7,064,531 B1 | 6/2006 | Zinn | |
| 7,075,329 B2 | 7/2006 | Chen et al. | |
| 7,078,963 B1 | 7/2006 | Andersen et al. | |
| 7,088,059 B2 | 8/2006 | McKinney et al. | |
| 7,102,902 B1 | 9/2006 | Brown et al. | |
| 7,106,603 B1 | 9/2006 | Lin et al. | |
| 7,109,791 B1 | 9/2006 | Epperson et al. | |
| 7,126,288 B2 | 10/2006 | Ribarich et al. | |
| 7,135,824 B2 | 11/2006 | Lys et al. | |
| 7,145,295 B1 | 12/2006 | Lee et al. | |
| 7,158,633 B1 | 1/2007 | Hein | |
| 7,161,816 B2 * | 1/2007 | Shteynberg et al. | 363/21.13 |
| 7,183,957 B1 | 2/2007 | Melanson | |
| 7,221,130 B2 | 5/2007 | Ribeiro et al. | |
| 7,233,135 B2 | 6/2007 | Noma et al. | |
| 7,246,919 B2 | 7/2007 | Porchia et al. | |
| 7,255,457 B2 | 8/2007 | Ducharm et al. | |
| 7,266,001 B1 | 9/2007 | Notohamiprodjo et al. | |
| 7,288,902 B1 | 10/2007 | Melanson | |
| 7,292,013 B1 | 11/2007 | Chen et al. | |
| 7,310,244 B2 | 12/2007 | Yang et al. | |
| 7,375,476 B2 | 5/2008 | Walter et al. | |
| 7,511,437 B2 | 3/2009 | Lys et al. | |
| 7,538,499 B2 | 5/2009 | Ashdown | |
| 7,545,130 B2 | 6/2009 | Latham | |
| 7,554,473 B2 | 6/2009 | Melanson | |
| 7,569,996 B2 | 8/2009 | Holmes et al. | |
| 7,656,103 B2 | 2/2010 | Shteynberg et al. | |
| 7,719,248 B1 * | 5/2010 | Melanson | 323/283 |
| 2002/0145041 A1 | 10/2002 | Muthu et al. | |
| 2002/0150151 A1 | 10/2002 | Krone et al. | |
| 2002/0166073 A1 | 11/2002 | Nguyen et al. | |
| 2003/0095013 A1 | 5/2003 | Melanson et al. | |
| 2003/0223255 A1 | 12/2003 | Ben-Yaakov | |
| 2004/0046683 A1 | 3/2004 | Mitamura et al. | |
| 2004/0085030 A1 | 5/2004 | Laflamme et al. | |
| 2004/0085117 A1 | 5/2004 | Melbert et al. | |
| 2004/0169477 A1 | 9/2004 | Yancie et al. | |
| 2004/0227571 A1 | 11/2004 | Kuribayashi | |
| 2004/0228116 A1 | 11/2004 | Miller et al. | |
| 2004/0232971 A1 | 11/2004 | Kawasake et al. | |
| 2004/0239262 A1 | 12/2004 | Ido et al. | |
| 2005/0057237 A1 | 3/2005 | Clavel | |
| 2005/0156770 A1 | 7/2005 | Melanson | |
| 2005/0184895 A1 | 8/2005 | Petersen et al. | |
| 2005/0207190 A1 | 9/2005 | Gritter | |
| 2005/0218838 A1 | 10/2005 | Lys | |
| 2005/0253533 A1 | 11/2005 | Lys et al. | |
| 2005/0270813 A1 | 12/2005 | Zhang et al. | |
| 2005/0275354 A1 | 12/2005 | Hausman, Jr. et al. | |
| 2005/0275386 A1 | 12/2005 | Jepsen et al. | |
| 2006/0022916 A1 | 2/2006 | Aiello | |

| | | | |
|---|---|---|---|
| 2006/0023002 | A1 | 2/2006 | Hara et al. |
| 2006/0125420 | A1 | 6/2006 | Boone et al. |
| 2006/0226795 | A1 | 10/2006 | Walter et al. |
| 2006/0238136 | A1 | 10/2006 | Johnson, III et al. |
| 2006/0261754 | A1 | 11/2006 | Lee |
| 2007/0029946 | A1 | 2/2007 | Yu et al. |
| 2007/0040512 | A1 | 2/2007 | Jungwirth et al. |
| 2007/0053182 | A1 | 3/2007 | Robertson |
| 2007/0103949 | A1 | 5/2007 | Tsuruya |
| 2007/0124615 | A1 | 5/2007 | Orr |
| 2007/0182699 | A1 | 8/2007 | Ha et al. |
| 2008/0130322 | A1 | 6/2008 | Artusi et al. |
| 2008/0174372 | A1 | 7/2008 | Tucker et al. |
| 2008/0192509 | A1 | 8/2008 | Dhuyvetter et al. |
| 2008/0224635 | A1 | 9/2008 | Hayes |
| 2008/0232141 | A1 | 9/2008 | Artusi et al. |
| 2008/0259655 | A1 | 10/2008 | Wei et al. |
| 2008/0278132 | A1 | 11/2008 | Kesterson et al. |
| 2009/0147544 | A1 | 6/2009 | Melanson |
| 2009/0218960 | A1 | 9/2009 | Lyons et al. |

FOREIGN PATENT DOCUMENTS

| | | |
|---|---|---|
| EP | 0910168 A1 | 4/1999 |
| EP | 1014563 | 6/2000 |
| EP | 1164819 A | 12/2001 |
| EP | 1213823 A2 | 6/2002 |
| EP | 1528785 A | 5/2005 |
| GB | 2069269 A | 8/1981 |
| WO | 01/15316 A1 | 1/2001 |
| WO | 02/15386 A2 | 2/2001 |
| WO | 01/97384 A | 12/2001 |
| WO | WO0227944 | 4/2002 |
| WO | 02/091805 A2 | 11/2002 |
| WO | WO 2006/022107 A | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

PCT International Search Report and Written Opinion of the International Searching Authority for PCT/US2008/062428, dated Sep. 15, 2008.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

Texas Instruments, Interleaving Continuous Conduction Mode PFC Controller, UCC28070, SLUS794C, Nov. 2007, revised Jun. 2009, Texas Instruments, Dallas TX.

D. Hausman, Lutron, RTISS-TE Operation, Real-Time Illumination Stability Systems for Trailing-Edge (Reverse Phase Control) Dimmers, v. 1.0 Dec. 2004.

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39E, Optimizing Performance in UC3854 Power Factor Correction Applications, Nov. 1994.

Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, Linear Technology, 2006.

Fairchild Semiconductor, FAN7544, Simple Ballast Controller, Rev. 1.0.0, 2004.

Fairchild Semiconductor, FAN7532, Ballast Controller, Rev. 1.0.2, Jun. 2006.

Fairchild Semiconductor, FAN7711, Ballast Control IC, Rev. 1.0.2, Mar. 2007.

Fairchild Semiconductor, KA7541, Simple Ballast Controller, Rev. 1.0.3, 2001.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Freescale Semiconductor, Inc., Dimmable Light Ballast with Power Factor Correction, Design Reference Manual, DRM067, Rev. 1, Dec. 2005.

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, ON Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, 2000 http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

Linear Technology, "Single Switch PWM Controller with Auxiliary Boost Converter," LT1950 Datasheet, Linear Technology, Inc. Milpitas, CA, 2003.

Yu, Zhenyu, 3.3V DSP for Digital Motor Control, Texas Instruments, Application Report SPRA550 dated Jun. 1999.

International Rectifier, Data Sheet No. PD60143-O, Current Sensing Single Channel Driver, El Segundo, CA, dated Sep. 8, 2004.

Balogh, Laszlo, "Design and Application Guide for High Speed MOSFET Gate Drive Circuit" [Online] 2001, Texas Instruments, Inc., SEM-1400, Unitrode Power Supply Design Seminar, Topic II, TI literature No. SLUP133, XP002552367, Retrieved from the Internet: URL:htt://focus.ti.com/lit/ml/slup169/slup169.pdf the whole document.

PCT US2008/062428 International Preliminary Report on Patentability and Written Opinion dated Nov. 12, 2009.

Infineon, CCM-PFC Standalone Power Factor Correction (PFC) Controller in Continuous Conduction Mode (CCM), Version 2.1, Feb. 6, 2007.

International Rectifier, IRAC1150-300W Demo Board, User's Guide, Rev 3.0, Aug. 2, 2005.

International Rectifier, Application Note AN-1077,PFC Converter Design with IR1150 One Cycle Control IC, rev. 2.3, Jun. 2005.

International Rectifier, Data Sheet PD60230 revC, Feb. 5, 2007.

Lu et al., International Rectifier, Bridgeless PFC Implementation Using One Cycle Control Technique, 2005.

Linear Technology, LT1248, Power Factor Controller, Apr. 20, 2007.

ON Semiconductor, AND8123/D, Power Factor Correction Stages Operating in Critical Conduction Mode, Sep. 2003.

ON Semiconductor, MC33260, GreenLine Compact Power Factor Controller: Innovative Circuit for Cost Effective Solutions, Sep. 2005.

ON Semiconductor, NCP1605, Enhanced, High Voltage and Efficient Standby Mode, Power Factor Controller, Feb. 2007.

ON Semconductor, NCP1606, Cost Effective Power Factor Controller, Mar. 2007.

ON Semiconductor, NCP1654, Product Review, Power Factor Controller for Compact and Robust, Continuous Conduction Mode Pre-Converters, Mar. 2007.

Philips, Application Note, 90W Resonant SMPS with TEA1610 SwingChip, AN99011, 1999.

NXP, TEA1750, GreenChip III SMPS control IC Product Data Sheet, Apr. 6, 2007.

Renesas, HA16174P/FP, Power Factor Correction Controller IC, Jan. 6, 2006.

Renesas Technology Releases Industry's First Critical-Conduction-Mode Power Factor Correction Control IC Implementing Interleaved Operation, Dec. 18, 2006.

Renesas, Application Note R2A20111 EVB, PFC Control IC R2A20111 Evaluation Board, Feb. 2007.

STMicroelectronics, L6563, Advanced Transition-Mode PFC Controller, Mar. 2007.

Texas Instruments, Application Note SLUA321, Startup Current Transient of the Leading Edge Triggered PFC Controllers, Jul. 2004.

Texas Instruments, Application Report, SLUA309A, Avoiding Audible Noise at Light Loads when using Leading Edge Triggered PFC Converters, Sep. 2004.

Texas Instruments, Application Report SLUA369B, 350-W, Two-Phase Interleaved PFC Pre-Regulator Design Review, Mar. 2007.

Unitrode, High Power-Factor Preregulator, Oct. 1994.

Texas Instruments, Transition Mode PFC Controller, SLUS515D, Jul. 2005.

Unitrode Products From Texas Instruments, Programmable Output Power Factor Preregulator, Dec. 2004.

Unitrode Products From Texas Instruments, High Performance Power Factor Preregulator, Oct. 2005.

Texas Instruments, UCC3817 BiCMOS Power Factor Preregulator Evaluation Board User's Guide, Nov. 2002.

Unitrode, L. Balogh, Design Note UC3854A/B and UC3855A/B Provide Power Limiting with Sinusoidal Input Current for PFC Front Ends, SLUA196A, Nov. 2001.

A. Silva De Morais et al., A High Power Factor Ballast Using a Single Switch with Both Power Stages Integrated, IEEE Transactions on Power Electronics, vol. 21, No. 2, Mar. 2006.

M. Ponce et al., High-Efficient Integrated Electronic Ballast for Compact Fluorescent Lamps, IEEE Transactions on Power Electronics, vol. 21, No. 2, Mar. 2006.

A. R. Seidel et al., A Practical Comparison Among High-Power-Factor Electronic Ballasts with Similar Ideas, IEEE Transactions on Industry Applications, vol. 41, No. 6, Nov.-Dec. 2005.

F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.

J. A. Vilela Jr. et al., An Electronic Ballast with High Power Factor and Low Voltage Stress, IEEE Transactions on Industry Applications, vol. 41, No. 4, Jul./Aug. 2005.

S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.

M. K. Kazimierczuk et al., Electronic Ballast for Fluorescent Lamps, IEEE Transactions on Power Electronics, vol. 8, No. 4, Oct. 1993.

S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.

H. L. Cheng et al., A Novel Single-Stage High-Power-Factor Electronic Ballast with Symmetrical Topology, IEEE Transactions on Power Electronics, vol. 50, No. 4, Aug. 2003.

J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.

Q. Li et al., An Analysis of the ZVS Two-Inductor Boost Converter under Variable Frequency Operation, IEEE Transactions on Power Electronics, vol. 22, No. 1, Jan. 2007.

H. Peng et al., Modeling of Quantization Effects in Digitally Controlled DC-DC Converters, IEEE Transactions on Power Electronics, vol. 22, No. 1, Jan. 2007.

G. Yao et al., Soft Switching Circuit for Interleaved Boost Converters, IEEE Transactions on Power Electronics, vol. 22, No. 1, Jan. 2007.

C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.

W. Zhang et al., A New Duty Cycle Control Strategy for Power Factor Correction and FPGA Implementation, IEEE Transactions on Power Electronics, vol. 21, No. 6, Nov. 2006.

H. Wu et al., Single Phase Three-Level Power Factor Correction Circuit with Passive Lossless Snubber, IEEE Transactions on Power Electronics, vol. 17, No. 2, Mar. 2006.

O. Garcia et al., High Efficiency PFC Converter to Meet EN61000-3-2 AND A14, Proceedings of the 2002 IEEE International Symposium on Industrial Electronics, vol. 3, 2002.

P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27, 1992.

Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

ST Datasheet L6562, Transition-Mode PFC Controller, 2005, STMicroelectronics, Geneva, Switzerland.

Maksimovic, Regan Zane and Robert Erickson, Impact of Digital Control in Power Electronics, Proceedings of 2004 International Symposium on Power Semiconductor Devices & Ics, Kitakyushu, Apr. 5, 2010, Colorado Power Electronics Center, ECE Department, University of Colorado, Boulder, CO.

"HV9931 Unity Power Factor LED Lamp Driver, Initial Release", SUPERTEX, Inc., Sunnyvale, CA USA 2005.

AN-H52 Application Note: "HV9931 Unity Power Factor LED Lamp Driver" Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conferrence, 2007. PESC 2007. IEEE, IEEE, P1, Jun. 1, 2007, pp. 1398-1404.

Spiazzi G et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search Report PCT/US2008/062387 dated Feb. 5, 2008.

Noon, Jim "UC3855A/B High Performance Power Factor Preregulator", Texas Instruments, SLUA146A, May 1996, Revised Apr. 2004.

International Search Report PCT/GB2006/003259 dated Jan. 12, 2007.

Written Opinion of the International Searching Authority PCT/US2008/056739 dated Dec. 3, 2008.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search Report PCT/US2008/062387 dated Jan. 10, 2008.

Data Sheet LT3496 Triple Output LED Driver, Linear Technology Corporation, Milpitas, CA 2007.

Linear Technology, News Release, Triple Output LED, LT3496, Linear Technology, Milpitas, CA, May 24, 2007.

\* cited by examiner

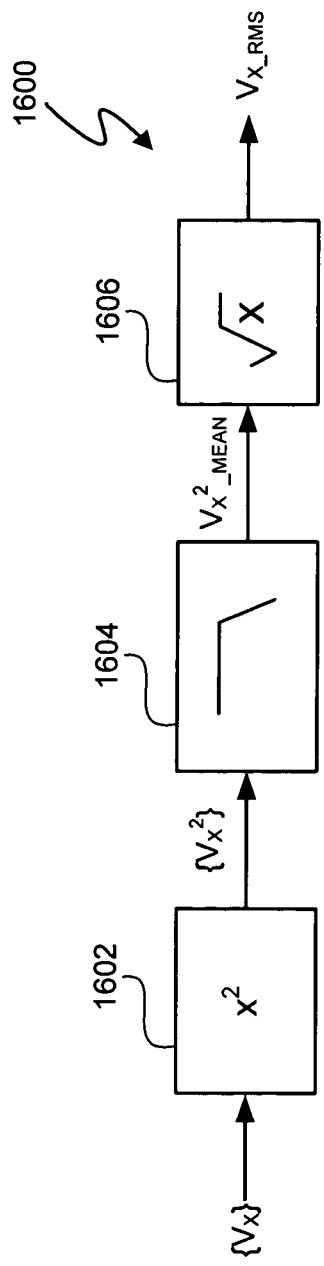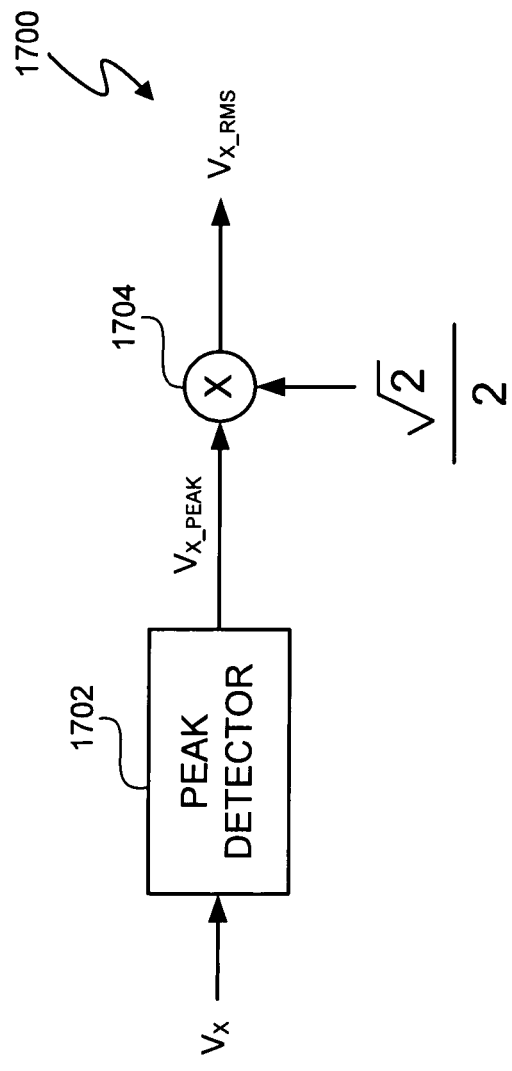
*Figure 16*
*Figure 17*

US 7,894,216 B2

SWITCHING POWER CONVERTER WITH EFFICIENT SWITCHING CONTROL SIGNAL PERIOD GENERATION

CROSS-REFERENCE TO RELATED APPLICATION

This application claims the benefit under 35 U.S.C. §119(e) and 37 C.F.R. §1.78 of U.S. Provisional Application No. 60/915,547, filed on May 2, 2007 and entitled "Power Factor Correction (PFC) Controller Apparatuses and Methods".

BACKGROUND OF THE INVENTION

1. Field of the Invention

The present invention relates in general to the field of electronics, and more specifically to a system and method for voltage conversion using a switching power converter with efficient switching control signal period generation.

2. Description of the Related Art

Many devices utilize electrical power to operate. Power is initially supplied by a power source, such as a public utility company, and power sources generally provide a steady state input voltage. However, the voltage levels utilized by various devices may differ from the steady state input voltage provided by the power source. For example, light emitting diode (LED) based lighting systems, typically operate from voltage levels that differ from voltage level supplied by a public utility company. To accommodate the difference between the voltage from the power source and the voltage utilized by the device, power converters are connected between the power source and the device to convert a supply voltage level from an alternating current (AC) power source to, for example, another AC power source having a voltage level different than the supply voltage level. Power converters can also convert AC power into direct (DC) power and DC power into AC power.

Switching power converters represent one example of a type of power converter. A switching power converter utilizes switching and energy storage technology to convert an input voltage into an output voltage suitable for use by a particular device connected to the switching power converter.

FIG. 1 depicts a power control system 100, which includes a switching power converter 102. Voltage source 101 supplies an AC input "mains" voltage $V_{mains}$ to a full, diode bridge rectifier 103. The voltage source 101 is, for example, a public utility, and the AC mains voltage $V_{mains}$ is, for example, a 60 Hz/120 V mains voltage in the United States of America or a 50 Hz/230 V mains voltage in Europe. The rectifier 103 rectifies the input mains voltage $V_{mains}$. The rectifier 103 rectifies the input mains voltage $V_{mains}$ and supplies a rectified, time-varying, primary supply voltage $V_X$ to the switching power converter. The switching power converter 102 provides approximately constant voltage power to load 112 while maintaining a resistive input characteristic to voltage source 101. Providing approximately constant voltage power to load 112 while maintaining an approximately resistive input characteristic to voltage source 101 is referred to as power factor correction (PFC). Thus, a power factor corrected switching power converter 102 is controlled so that an input current $i_L$ to the switching power converter 102 varies in approximate proportion to the AC mains voltage $V_{mains}$.

PFC and output voltage controller 114 controls the conductivity of PFC switch 108 so as to provide power factor correction and to regulate the output voltage $V_C$ of switching power converter 102. The PFC and output voltage controller 114 attempts to control the inductor current $i_L$ so that the average inductor current $i_L$ is linearly and directly proportional to the primary supply voltage $V_X$. A proportionality constant relates the inductor current $i_L$ to the primary supply voltage $V_X$, and the proportionality constant is adjusted to regulate the voltage to load 112. The PFC and output voltage controller 114 supplies a pulse width modulated (PWM) switch control signal $CS_0$ to control the conductivity of switch 108. In at least one embodiment, switch 108 is a field effect transistor (FET), and switch control signal $CS_0$ is the gate voltage of switch 108. The values of the pulse width and duty cycle of switch control signal $CS_0$ depend on at least two signals, namely, the primary supply voltage $V_X$ and the capacitor voltage/output voltage $V_C$. Output voltage $V_C$ is also commonly referred to as a "link voltage". Current control loop 119 provides current $i_{RTN}$ to PFC and output voltage controller 114 to allow PFC and output voltage controller 114 to adjust an average $i_L$ current 210 (FIG. 2) to equal a target $i_L$ current 208 (FIG. 2).

Capacitor 106 supplies stored energy to load 112 when diode 111 is reverse biased and when the primary supply voltage $V_X$ is below the RMS value of the input mains. The value of capacitor 106 is a matter of design choice and, in at least one embodiment, is sufficiently large so as to maintain a substantially constant output voltage $V_C$, as established by a PFC and output voltage controller 114. A typical value for capacitor 106, when used with a 400 V output voltage $V_C$, is 1 microfarad per watt of maximum output power supplied via switching power converter 102. The output voltage $V_C$ remains at a substantially constant target value during constant load conditions with ripple at the frequency of primary supply voltage $V_X$. However, as load conditions change, the output voltage $V_C$ changes. The PFC and output voltage controller 114 responds to the changes in voltage $V_C$ by adjusting the switch control signal $CS_0$ to return the output voltage $V_C$ to the target value. In at least one embodiment, the PFC and output voltage controller 114 includes a small capacitor 115 to filter any high frequency signals from the primary supply voltage $V_X$.

The switching power converter 102 incurs switching losses each time switch 108 switches between nonconductive and conductive states due to parasitic impedances. The parasitic impedances include a parasitic capacitance 132 across switch 108. During each period TT of switching switch control signal $CS_0$, energy is used to, for example, charge parasitic capacitance 132. Thus, switching power converter 102 incurs switching losses during each period TT of switch control signal $CS_0$.

PFC and output voltage controller 114 controls switching power converter 102 so that a desired amount of power is transferred to capacitor 106. The desired amount of power depends upon the voltage and current requirements of load 112. An input voltage control loop 116 provides a sample of primary supply voltage $V_X$ to PFC and output voltage controller 114. PFC and output voltage controller 114 determines a difference between a reference voltage $V_{REF}$, which indicates a target voltage for output voltage $V_C$, and the actual output voltage $V_C$ sensed from node 122 and received as feedback from voltage loop 118. The PFC and output voltage controller 114 generally utilizes technology, such as proportional integral (PI) compensation control, to respond to differences in the output voltage $V_C$ relative to the reference voltage $V_{REF}$. The PFC and output voltage controller 114 processes the differences to smoothly adjust the output voltage $V_C$ to avoid causing rapid fluctuations in the output voltage $V_C$ in response to small error signals. The PFC and output voltage controller 114 generates a pulse width modulated switch control signal $CS_0$ that drives switch 108. Prodić, *Compensator Design and Stability Assessment for Fast Voltage Loops of Power Factor Correction Rectifiers*, IEEE Transactions on Power Electronics, Vol. 12, No. 5, September 1007, pp. 1719-1729 (referred to herein as "Prodić"), describes an example of PFC and output voltage controller 114.

FIGS. 2 and 3 depict respective switching control strategies utilized by typical switching power converters, such as switching power converter 102, to convert the input voltage $V_X$ into a power factor corrected output voltage $V_C$. FIG. 2 depicts a transition switching strategy, and FIG. 3 depicts a constant period switching strategy. Referring to FIGS. 1 and 2, PFC and output voltage controller 114 controls the conductivity of PFC switch 108. The primary supply voltage $V_X$ 202 is, in at least one embodiment, a rectified sine wave. To regulate the amount of power transferred and maintain a power factor close to one, PFC and output voltage controller 114 varies the period TT of switch control signal $CS_0$ so that the inductor current $i_L$ (also referred to as the 'input current') tracks changes in primary supply voltage $V_X$ and holds the output voltage $V_C$ constant. The transition switching strategy 204 illustrates that, as the primary supply voltage $V_X$ increases, PFC and output voltage controller 114 increases the period TT of switch control signal $CS_0$. As the primary supply voltage $V_X$ decreases, PFC and output voltage controller 114 decreases the period of switch control signal $CS_0$. In one embodiment of transition switching strategy 204, the pulse width time T1 is approximately constant.

Time T2 represents the flyback time of inductor 110 that occurs when switch 108 is nonconductive and the diode 111 is conductive. In at least one embodiment, the value of inductor 110 is a matter of design choice. In at least one embodiment, the value of inductor 110 is chosen to store sufficient power transferred from voltage source 101 when switch 108 conducts in order to transfer power to capacitor 106 when switch 108 is non-conductive to maintain a desired output voltage $V_C$. For the transition switching strategy 204, the pulse width time T1 plus the flyback time T2 equals the period TT of switch control signal $CS_0$.

The inductor current $i_L$ waveform 206 depicts the general behavior of inductor current $i_L$ over time relative to the primary supply voltage $V_X$. The inductor current $i_L$ ramps 'up' during pulse width T1 when the switch 108 conducts, i.e. is "ON". The inductor current $i_L$ ramps down during flyback time T2 when switch 108 is nonconductive, i.e. is "OFF", and supplies inductor current $i_L$ through diode 111 to recharge capacitor 106. Discontinuous conduction mode (DCM) occurs when the inductor current $i_L$ reaches 0 during the period TT of switch control signal $CS_0$. Continuous conduction mode (CCM) occurs when the inductor current $i_L$ is greater than 0 during the entire period TT. Transition switching strategy 204 operates switching power converter 102 at the boundary of DCM and CCM by beginning each period of switch control signal $CS_0$ when the inductor current $i_L$ just equals 0. The frequency 1/TT of switch control signal $CS_0$ is, for example, between 20 kHz and 130 kHz. The period TT of switch control signal $CS_0$ and, thus, the duration of each cycle of inductor $i_L$ depicted in inductor current $i_L$ waveform 206 is exaggerated for visual clarity. Transition switching strategy 204 operates the switch 108 at high frequencies when little power is transferred from voltage source 101, such as near the zero crossing 212 of the mains voltage $V_{mains}$ and at light load, i.e. when the power demand of load 112 is light.

The PFC and output voltage controller 114 sets a target current 208 that tracks the primary supply voltage $V_X$. When the inductor current $i_L$ reaches the target current 208 during the pulse width T1, the switch control signal $CS_0$ opens switch 108, and inductor current $i_L$ decreases to zero during flyback time T2. The average current 210 represents the average inductor current $i_L$. The average inductor current $i_L$ tracks the primary supply voltage $V_X$, thus, providing power factor correction.

Referring to FIG. 3, the constant period switching strategy 302 maintains a constant period TT of switch control signal $CS_0$ and varies the pulse width T1 of switch control signal $CS_0$ to control inductor current $i_L$. As the primary supply voltage $V_X$ increases from 0 to line peak, PFC and output voltage controller 114 decreases the pulse width T1 of switch control signal $CS_0$. Constant period switching strategy 302 operates switching power converter 102 in DCM so that the flyback time T2 plus the pulse width T1 is less than or equal to the period TT of switch control signal $CS_0$. Inductor current $i_L$ waveform 304 depicts the effects of the constant period switching strategy 302 on the inductor current $i_L$ relative to the primary supply voltage $V_X$. As with the transition switching strategy 204, for the constant period switching strategy 302, the PFC and output voltage controller 114 sets a target current 208 that tracks the primary supply voltage $V_X$. For constant period strategy 302, TT$\geq$(T1+T2), so switching power converter 102 operates in DCM.

PFC and output voltage controller 114 updates the switch control signal $CS_0$ at a frequency much greater than the frequency of input voltage $V_X$. The frequency of input voltage $V_X$ is generally 50-60 Hz. The frequency 1/TT of switch control signal $CS_0$ is, for example, between 10 kHz and 130 kHz. Frequencies at or above 20 kHz avoid audio frequencies and frequencies at or below 130 kHz avoids significant switching inefficiencies.

The constant period switching strategy 302 is not efficient in terms of switching losses versus power delivered to load 112. The transition switching strategy 204 is even less efficient than the constant period switching strategy 302.

SUMMARY OF THE INVENTION

In one embodiment of the present invention, a system includes a controller to generate a switch control signal to control conductivity of a switch included in a switching power converter. Controlling conductivity of the switch causes an input current to the switching power converter to vary in approximate proportion to a time varying voltage source signal supplied to the switching power converter. The controller includes a period generator to determine a period of the switch control signal so that the period of the switch control signal varies in accordance with at least one of:
  (i) the period of the switch control signal trends inversely to estimated power delivered to a load coupled to the switching power converter;
  (ii) the period of the switch control signal trends inversely to instantaneous voltage levels of the time-varying voltage source signal; and
  (iii) the period of the switch control signal trends directly with a line voltage level of the time-varying voltage source signal; and The controller also includes a pulse width generator to determine a pulse width of the switch control signal in response to at least one of: (i) the determined period of the switch control signal, (ii) the instantaneous voltage levels of the voltage source signal, and (iii) a voltage level of the output voltage signal of the switching power converter.

In another embodiment of the present invention, a method includes generating a switch control signal to control conductivity of a switch included in a switching power converter.

Controlling conductivity of the switch causes an input current to the switching power converter to vary in approximate proportion to a time varying voltage source signal supplied to the switching power converter. The method further includes determining a period of the switch control signal so that the period of the switch control signal varies in accordance with at least one of:

(i) the period of the switch control signal trends inversely to estimated power delivered to a load coupled to the switching power converter;
(ii) the period of the switch control signal trends inversely to instantaneous voltage levels of the voltage source signal; and
(iii) the period of the switch control signal trends directly with a line voltage level of the time-varying voltage source signal;

The method also includes determining a pulse width of the switch control signal in response to at least one of: (i) the determined period of the switch control signal, (ii) a voltage level of the voltage source signal, and (iii) a voltage level of the output voltage signal of the switching power converter. The method further includes providing the switch control signal to the switching power converter.

In another embodiment of the present invention, an apparatus includes means for generating a switch control signal to control conductivity of a switch included in a switching power converter. Controlling conductivity of the switch causes an input current to the switching power converter to vary in approximate proportion to a time varying voltage source signal supplied to the switching power converter. The apparatus further comprises means for determining a period of the switch control signal so that the period of the switch control signal varies in accordance with at least one of:

(i) the period of the switch control signal trends inversely to instantaneous power transferred to the switching power converter;
(ii) the period of the switch control signal trends inversely to voltage level changes of the voltage source signal; and
(iii) the period of the switch control signal trends directly with a line voltage level of the time-varying voltage source signal; and The apparatus also includes means for determining a pulse width of the switch control signal in response to at least one of: (i) the determined period of the switch control signal, (ii) a voltage level of the voltage source signal, and (iii) a voltage level of the output voltage signal of the switching power converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 16 and 17 depict respective root mean square value generators.

DETAILED DESCRIPTION

A power control system includes a switching power converter and a controller, and the controller responds to a time-varying voltage source signal by generating a switch control signal having a period that varies in accordance with at least one of: (i) the period of the switch control signal trends inversely to estimated power delivered to a load coupled to the switching power converter, (ii) the period of the switch control signal trends inversely to instantaneous voltage levels of the voltage source signal, and (iii) the period of the switch control signal trends directly with a line voltage level of the time-varying voltage source signal. The power control system also includes a pulse width generator to determine a pulse width of the switch control signal in response to at least one of (i) the determined period of the switch control signal, (ii) the instantaneous voltage levels of the voltage source signal, and (iii) a voltage level of the output voltage signal of the switching power converter. Thus, the period can be determined in accordance with a one-way function, two-way function, or three-way function of the variables: (i) estimated power delivered to a load coupled to the switching power converter, (ii) instantaneous voltage levels of the voltage source signal, and (iii) line voltage level of the time-varying voltage source signal (collectively referred to as the "Period Determination Variables"). A "one-way function" indicates that one of the Period Determination Variables (i), (ii), or (iii) is used to determine the switch control signal period. A "two-way function" indicates that any two of the Period Determination Variables (i), (ii), or (iii) are used to determine the switch control signal period. A "three-way function" indicates that all three of the Period Determination Variables (i), (ii), or (iii) are used to determine the switch control signal period.

For power supplies having a voltage source signal that approximates a sine wave, the switching power converter transfers 80% of the power from the voltage source to the load when a phase angle of the voltage source signal is between 45° and 135°. Switching losses in the switching power converter generally increase as switching periods decrease, or, in other words, switching losses in the switching power converter generally increase as switching frequencies increase. By varying the period of the switch control signal so that the period trends in accordance with the one-way function, two-way function, or three-way function of the Period Determination Variables, in at least one embodiment, the controller achieves an efficient correlation between the switching period with associated switching losses and the Period Determination Variable(s) while providing power factor correction (PFC).

Figure 1:
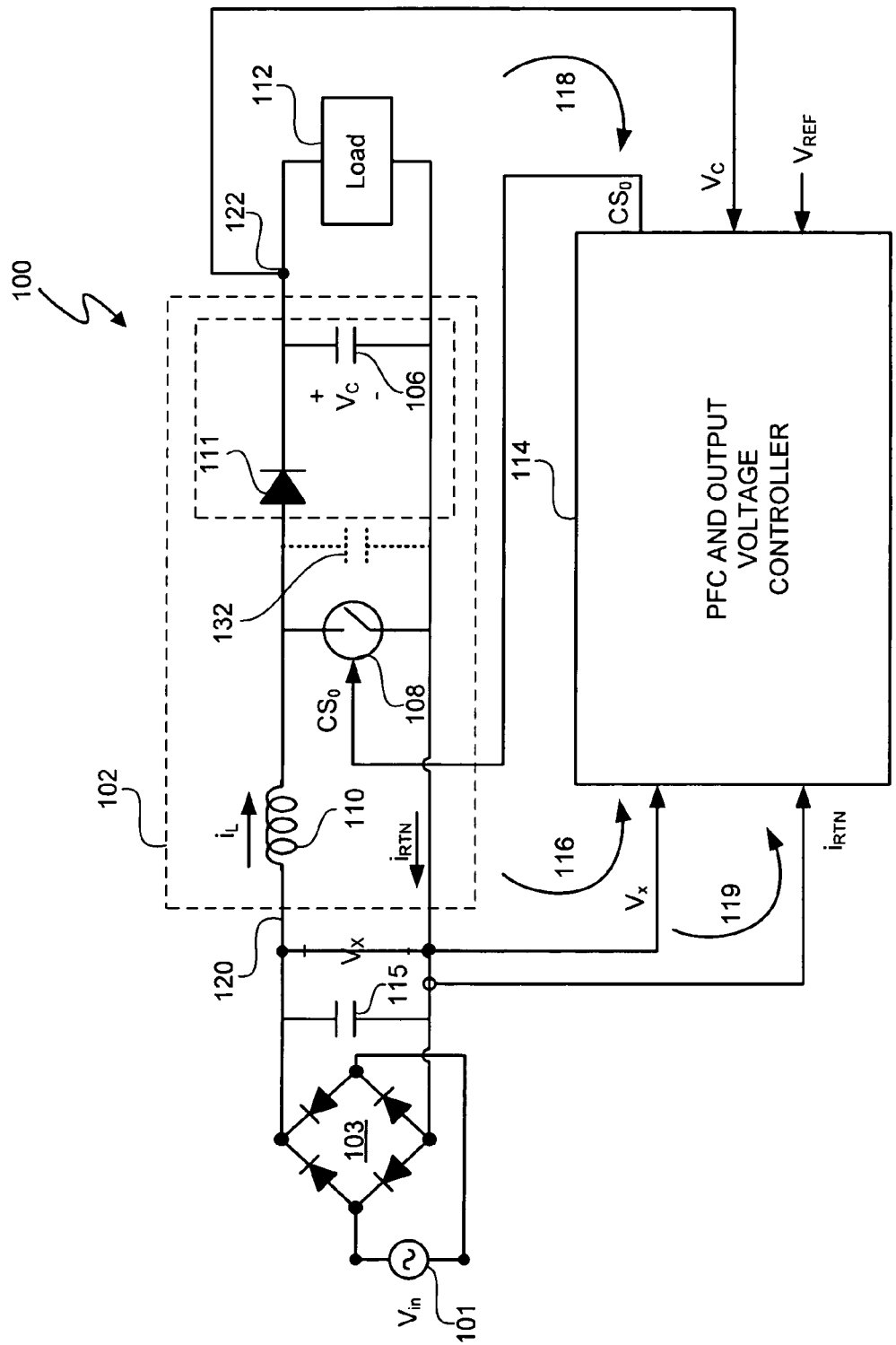
FIG. 1 (labeled prior art) depicts a power control system, which includes a switching power converter.
Figure 2:
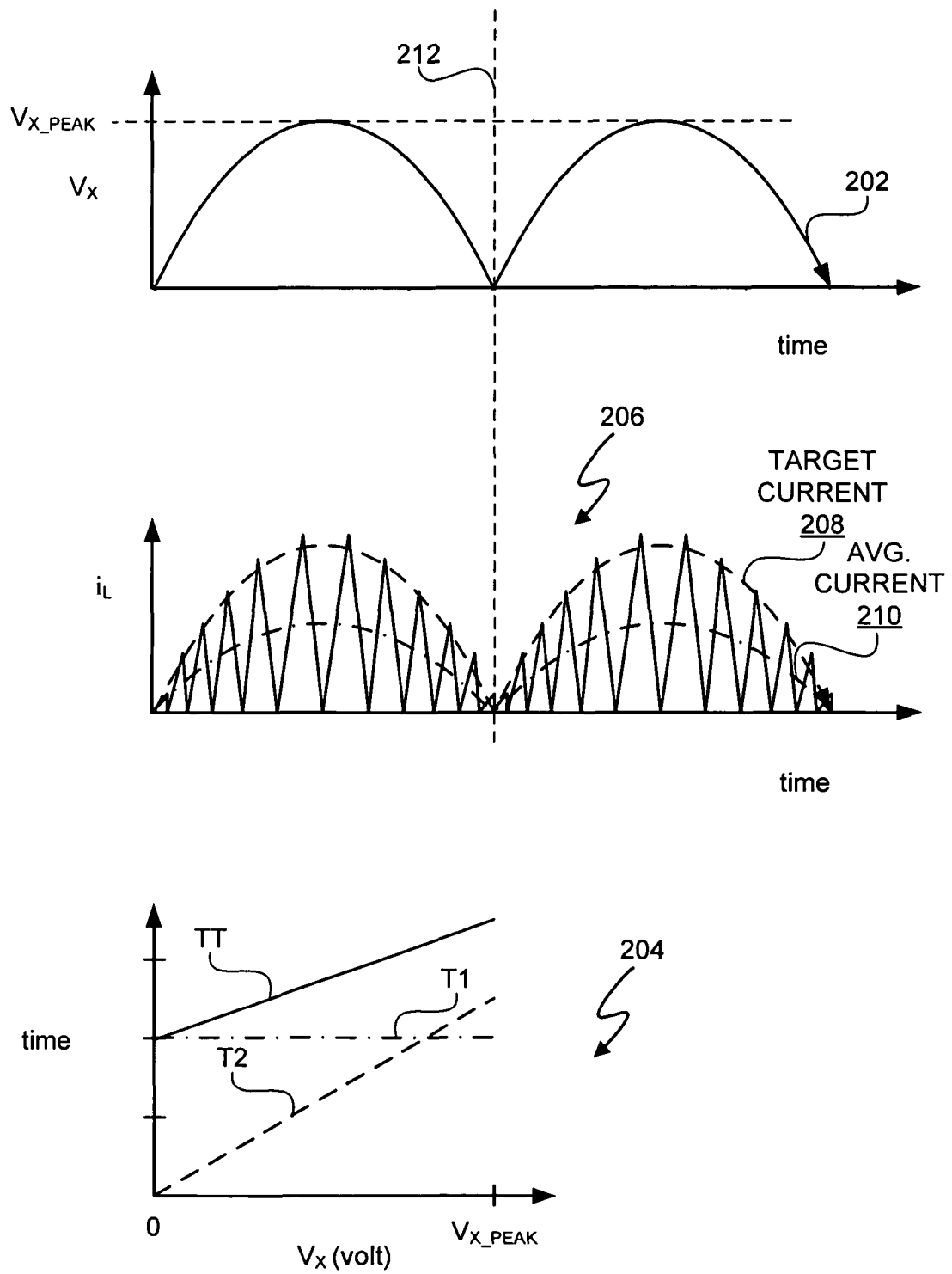
FIG. 2 (labeled prior art) depicts a transition switching control strategy and the effect of the transition switching control strategy on an inductor current of the switching power converter of FIG. 1.
Figure 3:
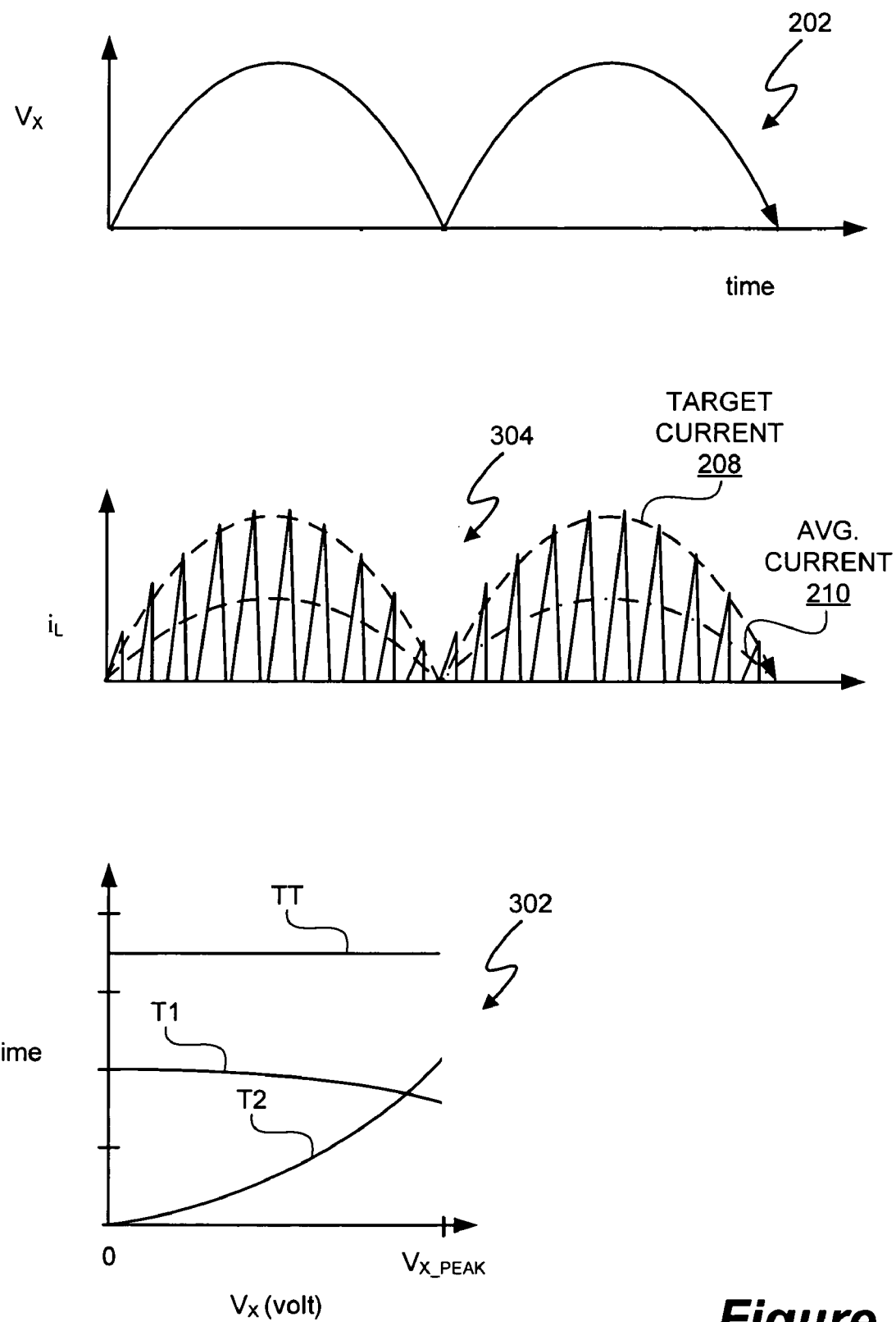
FIG. 3 (labeled prior art) depicts a constant period switching control strategy and the effect of the constant period switching control strategy on an inductor current of the switching power converter of FIG. 1.
Figure 4:
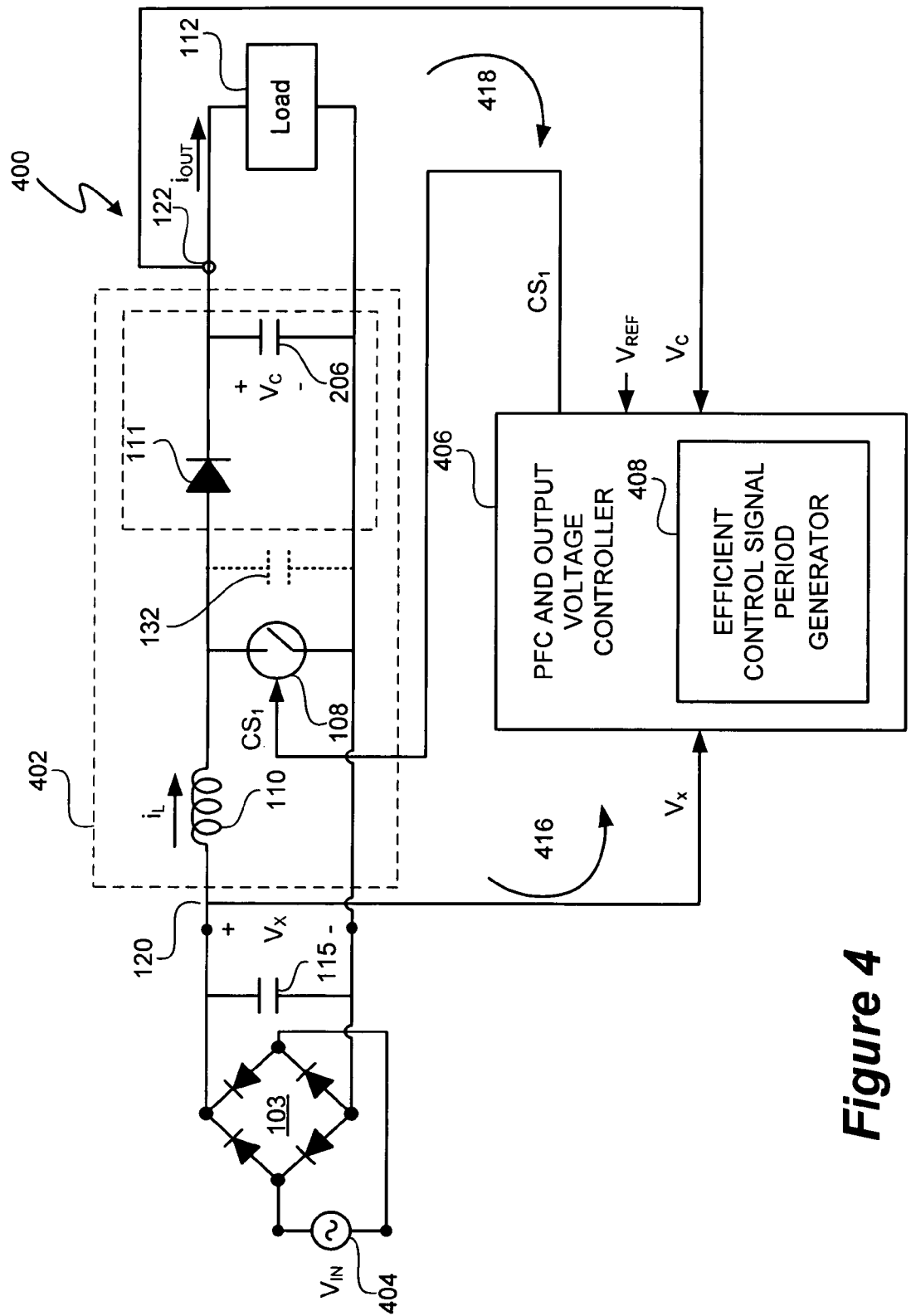
FIG. 4 depicts a power control system having a switching power converter and a control signal period-power transfer correlation strategy module.

FIG. 4 depicts a power control system 400 having a switching power converter 402 and an efficient control signal period generator 408. In at least one embodiment, switching power converter 402 is configured in the same manner as switching power converter 102. Rectifier 103 rectifies the input voltage $V_{IN}$ supplied by voltage source 404 to generate time varying, primary supply voltage $V_X$. In at least one embodiment, voltage source 404 is identical to voltage source 101, and input voltage $V_{IN}$ is identical to the mains voltage $V_{mains}$. Power control system 400 also includes PFC and output voltage controller 406. PFC and output voltage controller 406 generates switch control signal $CS_1$ using feedback signals representing the primary supply voltage $V_X$ and output voltage $V_C$. PFC and output voltage controller 406 includes the efficient control signal period generator 408 to efficiently correlate a period TT of switch control signal $CS_1$ with the Period Determination Variables to, for example, increase the efficiency of power control system 400.

In at least one embodiment, the Period Determination Variables are the: (i) estimated power delivered to load 112, (ii) instantaneous voltage levels of primary supply voltage $V_X$, and (iii) line voltage level of primary supply voltage $V_X$. In at least one embodiment, the estimated power delivered to load 112 is estimated by multiplying the average output voltage $V_C$ obtained via voltage control loop 418 and the average output current $i_{OUT}$ of switching power converter 402. In at least one embodiment, the estimated power delivered to load 112 is a value "K" determined by the load power demand estimator 803 of FIG. 8. In at least one embodiment, the instantaneous voltage levels of primary supply voltage $V_X$ represent a values of primary supply voltage $V_X$ sampled via voltage loop 416 at a rate approximately equal to 1/TT, where 1/TT represents the frequency of switch control signal $CS_1$. The term "instantaneous" includes delays, such as any transmission and processing delays, in obtaining the sampled value of primary supply voltage $V_X$. In at least one embodiment, the line voltage level of primary supply voltage $V_X$ represents a measure of the primary supply voltage $V_X$ for at least one period of primary supply voltage $V_X$. For example, in at least one embodiment, the line voltage level is the root mean square (RMS) of primary supply voltage $V_X$, a peak of primary supply RMS voltage $V_{X\_RMS}$, or an average of primary supply voltage $V_X$. For example, the line voltage in the United States of America is nominally 120 Vrms, and the line voltage in Europe is nominally 230 Vrms, where "Vrms" represents an RMS voltage. In general, the line voltage level and the load power demand will be updated at a rate of 50-240 Hz, and the instantaneous voltage will be updated at the switching frequency of switch 108, i.e. the frequency of switch control signal $CS_1$.

In at least one embodiment, the efficient control signal period generator 408 includes a control signal period strategy that allows the PFC and output voltage controller 406 to generate a period TT of the switch control signal $CS_1$ that varies in accordance with at least one of the Period Determination Variables.

Figure 5:
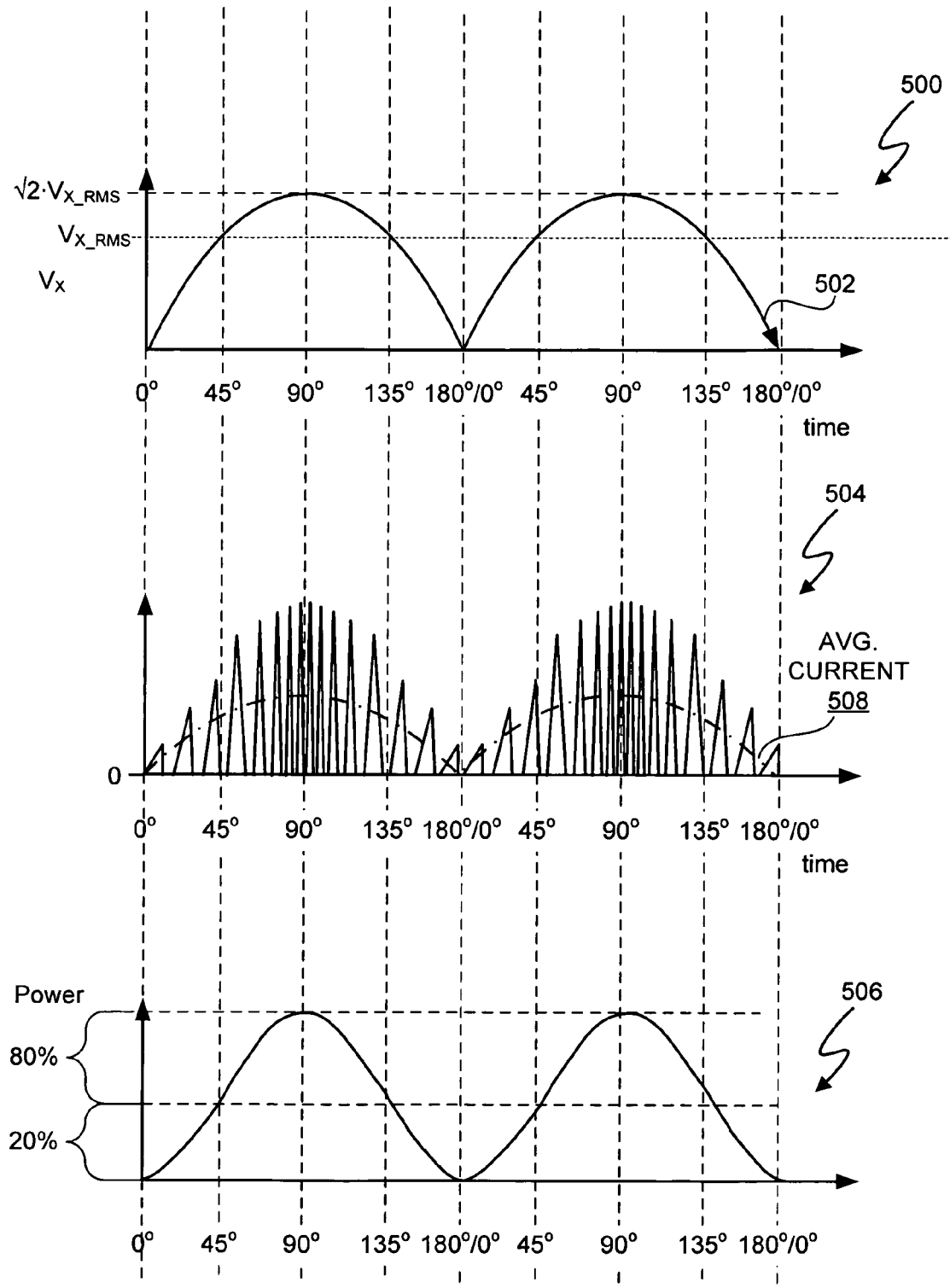
FIG. 5 depicts a collection of correlated waveforms that depict a correlation between a primary supply voltage, an inductor current, and transferred power in the power control system of FIG. 4.

FIG. 5 depicts a collection of correlated waveforms 500 that depict a correlation between the primary supply voltage $V_X$ 502, the inductor current $i_L$ 504, and power 506 transferred from voltage source 404 to switching power converter 402. One-half of the period of primary supply voltage $V_X$ occurs between phase angles 0°-45° plus phase angles 135°-180°. The RMS voltage of primary supply voltage $V_X$ equals the voltage at phase angles 45° and 135°. Thus, primary supply voltage $V_X$ is greater than the primary supply RMS voltage $V_{X\_RMS}$ for a time equal to half the period TT of primary supply voltage $V_X$ and less than the primary supply RMS voltage $V_{X\_RMS}$ for a time equal to half the period of TT. The peak voltage of a sine wave primary supply voltage $V_X$ is $\sqrt{2} \cdot V_{X\_RMS}$. To provide power factor correction, PFC and output voltage controller 406 generates switch control signal $CS_1$ so that the average inductor current $i_L$ 508 tracks the primary supply voltage $V_X$. Power 506 transferred from voltage source 404 to switching power converter 402 equals $V_X \cdot i_L$. Eighty percent of the power 506 is transferred to switching power converter 402 when primary supply voltage $V_X$ is greater than primary supply RMS voltage $V_{X\_RMS}$, and twenty percent of the power 506 is transferred when primary supply voltage $V_X$ is less than primary supply RMS voltage $V_{X\_RMS}$. In other words, 80% of the power 506 is transferred when primary supply voltage $V_X$ is between phase angles 45° and 135°, and 20% of the power 506 is transferred in the troughs of primary supply voltage $V_X$. In at least one embodiment, the troughs of primary supply voltage $V_X$ are below primary supply RMS voltage $V_{X\_RMS}$ and, for a sine wave, are between phase angles 0°-45° and between phase angles 135°-180°.

Switching power converter 402 also incurs switching losses each time switch 108 switches between nonconductive and conductive states due to parasitic impedances. During each period TT of switching switch control signal $CS_1$, power is used to, for example, charge parasitic capacitance 132. Switching power converter 402 incurs switching losses during each period TT of switch control signal $CS_1$. Thus, the higher the frequency of controls signal $CS_1$, the higher the switching loss.

Referring to FIGS. 1-5, with respect to the conventional transition switching strategy 204, the frequency of switch control signal $CS_0$ is highest between phase angles 0°-45° and phase angles 135°-180°. Thus, the conventional transition switching strategy 204 incurs the greatest switching loss during the time of the lowest amount of power transfer from voltage source 101 to switching power converter 102. In at least one embodiment, more than half (>50%) of the switching loss associated with the conventional transition switching strategy 204 occurs during the transfer of 20% of the power from voltage source 101 to switching power converter 102. The constant period switching strategy 302 is somewhat more efficient because only approximately 50% of the switching loss associated with the conventional transition switching strategy 204 occurs during the transfer of 20% of the power from voltage source 101 to switching power converter 102.

In at least one embodiment, the efficient control signal period generator 408 allows the PFC and output voltage controller 406 to improve the efficiency of power control system 400 by increasing the period TT of switch control signal $CS_1$, or in other words decreasing the switching rate of switch 108, during times of low power transfer to load 112, low instantaneous primary supply voltage $V_X$, and/or higher primary supply RMS voltage $V_{X\_RMS}$. Table 1 sets forth an exemplary switching loss to power transfer ratio comparison: The actual power savings and optimum switch control signal $CS_1$ period TT generation strategy depend on power components of power control system 400.

TABLE 1

| (44) SWITCHING STRATEGY | (45) EXEMPLARY SWITCHING LOSS |
|---|---|
| (46) Transition Switching Strategy 204 | (47) >50% switching of switch 108 in the troughs of primary supply voltage $V_X$ |
| (48) Constant Period Switching Strategy 302 | (49) 50% switching of switch 108 in the troughs of primary supply voltage $V_X$ |
| (50) Efficient Control Signal Period Generator 408 | (51) <50% switching of switch 108 in the troughs of primary supply voltage $V_X$. |

As previously stated, in at least one embodiment, the troughs of primary supply voltage $V_X$ are below primary supply RMS voltage $V_{X\_RMS}$ and, for a sine wave, are between phase angles 0°-45° and between phase angles 135°-180°.

Figure 6:
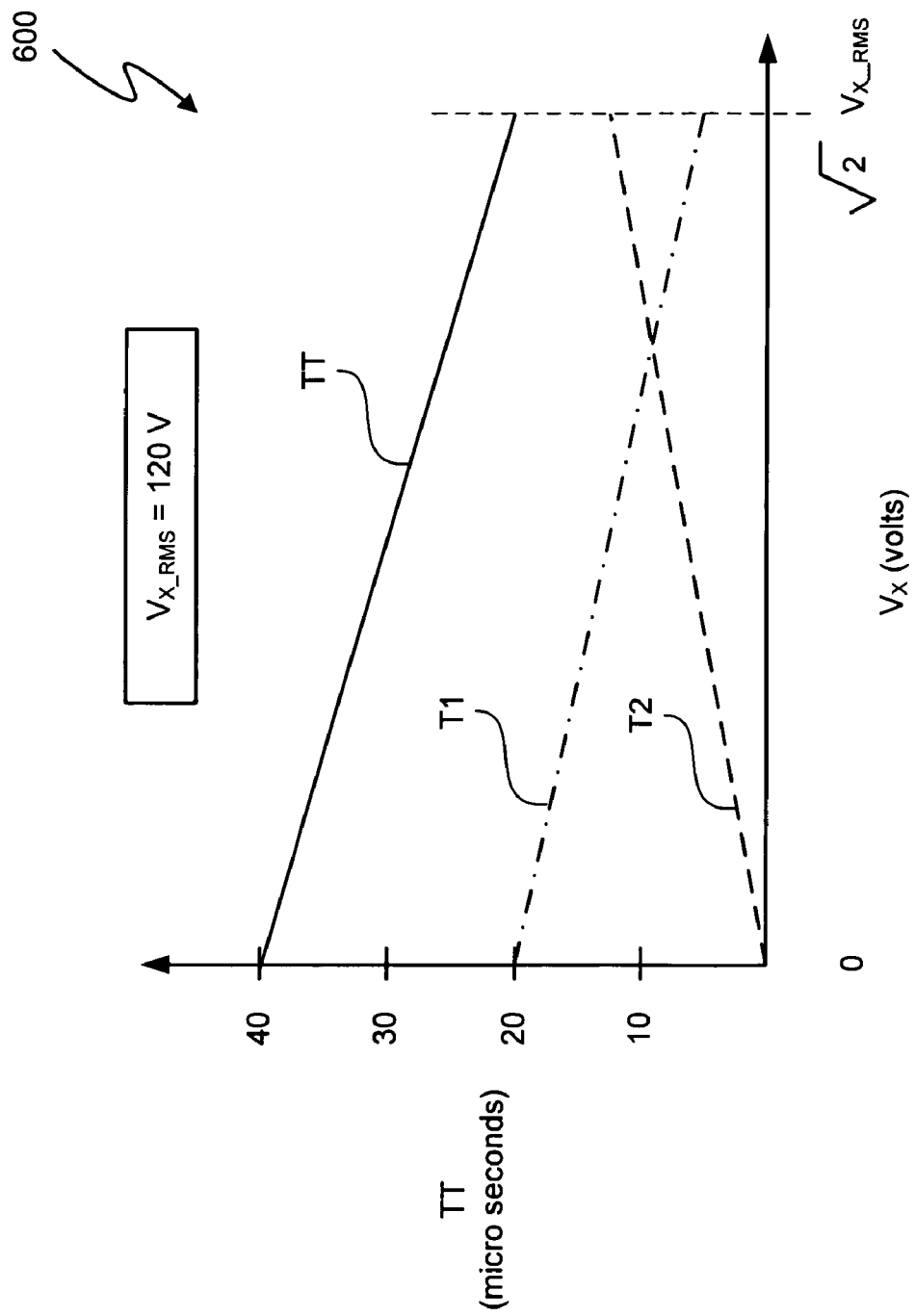
FIG. 6 depicts an efficient period-instantaneous primary supply voltage $V_X$ correlation strategy.

FIG. 6 depicts an exemplary efficient period-instantaneous primary supply voltage $V_X$ correlation strategy 600 for efficient control signal period generator 408. Referring to FIGS. 5 and 6, as primary supply voltage $V_X$ increases towards a peak voltage $\sqrt{2} \cdot V_{X\_RMS}$, the power transfer from voltage source 404 to switching power converter 402 increases non-linearly. For any given value of primary supply voltage $V_X$ and power output by switching power converter 402, there is an optimum switching period TT. The optimum period generally increases in the troughs of primary supply voltage $V_X$. If the period TT is too short, there is excess switching loss. If the period TT is too long, there will be excessive loss in resistive parasitics, such as the respective resistances of switch 108 and inductor 110 and in core losses of inductor 110. The efficient period-instantaneous primary supply voltage $V_X$ correlation strategy 600 provides a strategy for determining the period TT as a function of the instantaneous primary supply voltage $V_X$. The actual value of an optimal value of period TT is a matter of design choice and is, for example, dependent upon the values of the components of switching power converter 402 such as the characteristics of inductor 110, switch 108, capacitor 106, and diode 111 along with the instantaneous primary supply voltage $V_X$, the primary supply RMS voltage $V_{X\_RMS}$, and the power transferred to load 112. Power control system 400 is, in at least one embodiment, more efficient than conventional power control system 100 because the switching frequency of switch 108 increases as more power is supplied by voltage source 404, thus, the controller achieves an efficient correlation between the switching period with associated switching losses of switch 108.

In at least one embodiment, the switching power converter 402 operates in DCM. The frequency 1/TT of switch control signal $CS_1$ is, for example, between 10 kHz and 130 kHz. The period TT of switch control signal $CS_1$ and, thus, the duration of each cycle of inductor $i_L$ depicted in inductor current $i_L$ waveform 504 is exaggerated for visual clarity.

Figure 7:
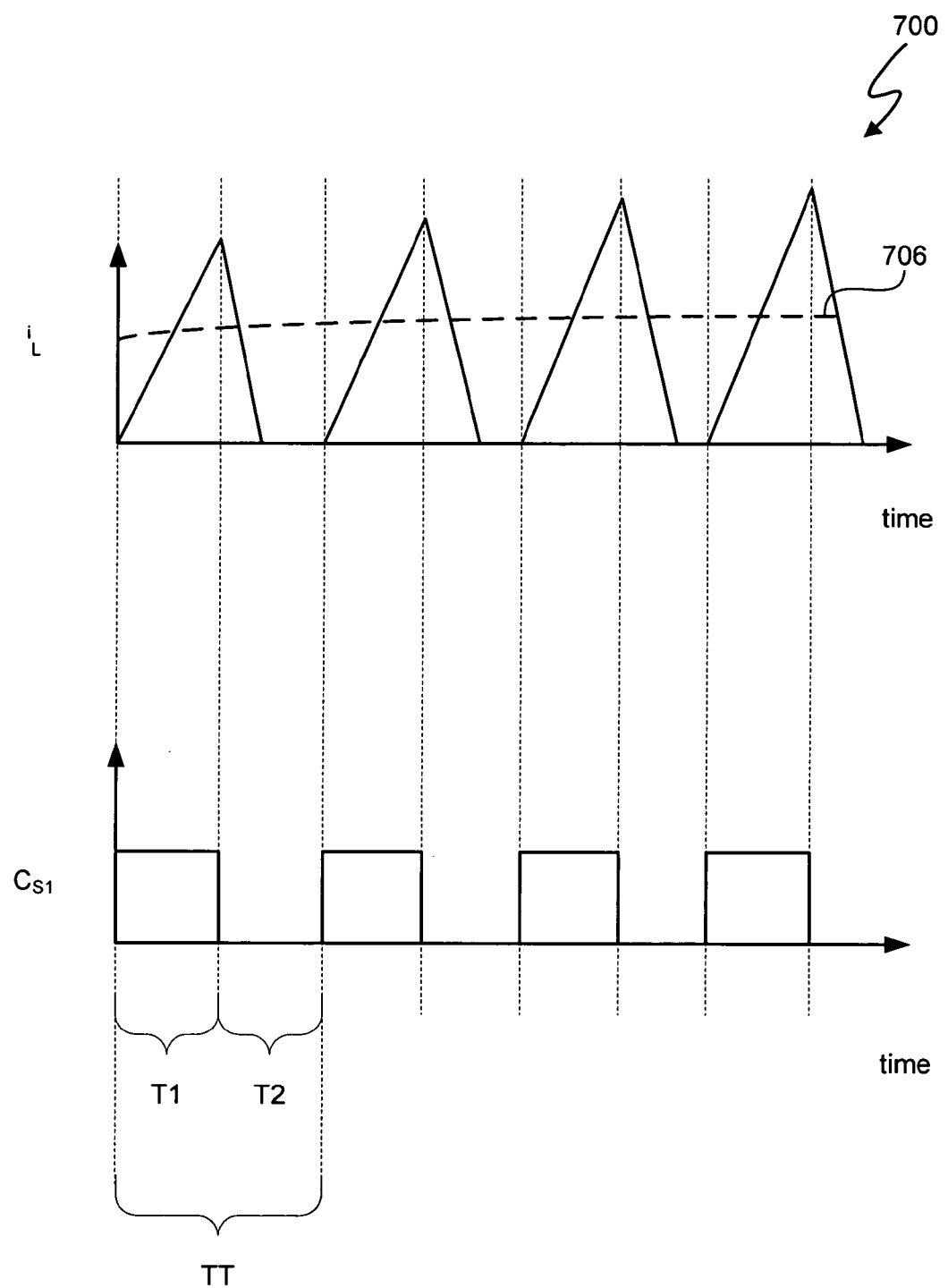
FIG. 7 depicts correlated waveforms between an inductor current and switch control signal of the power control system of FIG. 4.

FIG. 7 depicts exemplary, correlated waveforms 700 between an exemplary inductor current $i_L$ and switch control signal $CS_1$. During the time T1 of each pulse width of switch control signal $CS_1$, inductor current $i_L$ rises as energy is transferred from voltage source 404 to inductor 110. During the flyback time T2, inductor current $i_L$ decreases as the inductor stored energy charges capacitor 106. The average inductor current $i_{L\_AVG}$ 706 tracks primary supply voltage $V_X$ to provide power factor correction.

Figure 8:
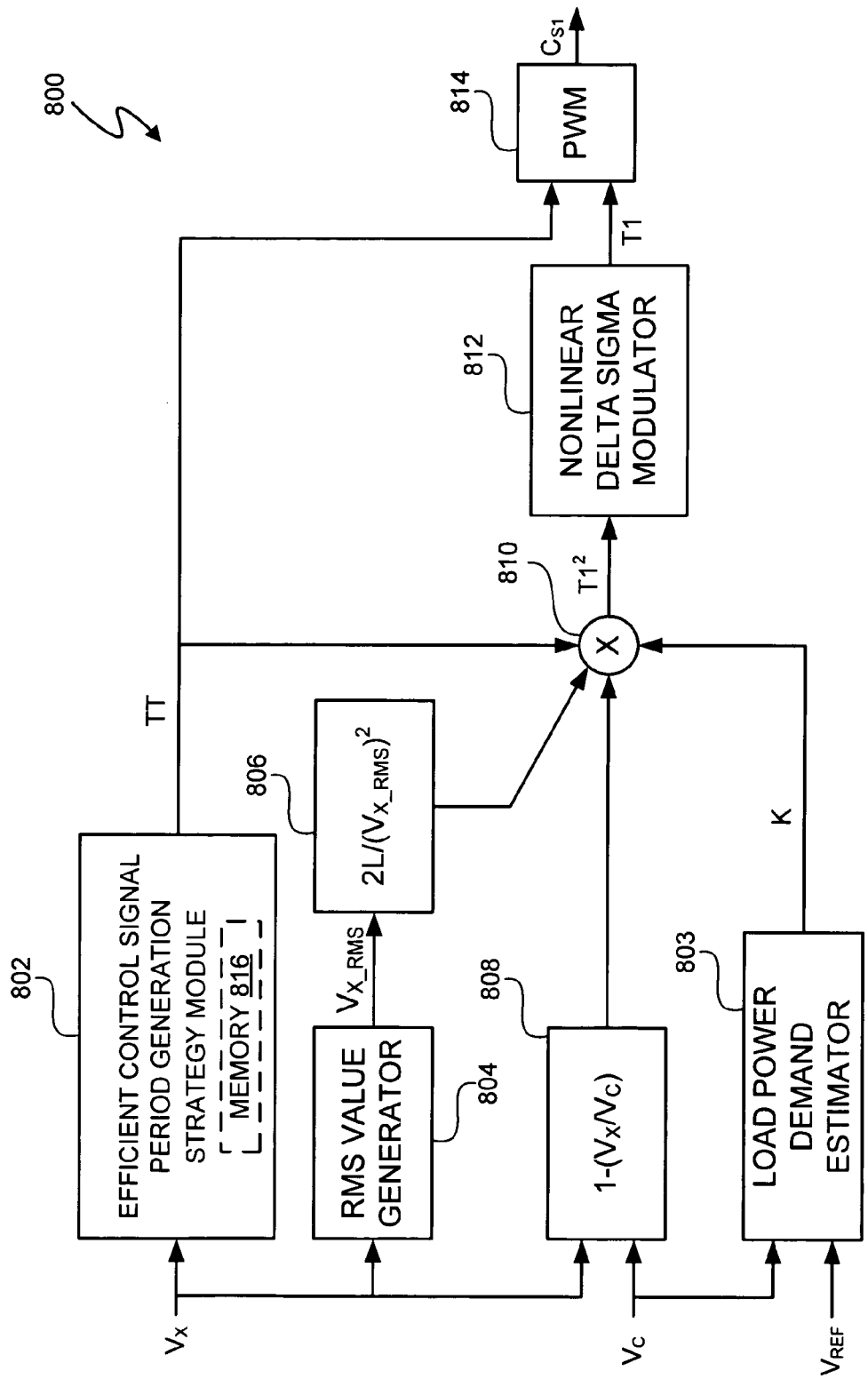
FIG. 8 depicts a power factor correction (PFC) and output voltage controller of the power control system of FIG. 4.

FIG. 8 depicts a PFC and output voltage controller 800, which represents one embodiment of PFC and output voltage controller 406. PFC and output voltage controller 800 determines switch control signal $CS_1$ in accordance with the switch control signal generation strategy implemented by control signal period generation strategy module 802. Efficient control signal period generation strategy module 802 represents one embodiment of efficient control signal period generator 408. In at least one embodiment, the control signal period generation strategy module 802 generates TT as a function of at least one of: the instantaneous primary supply voltage $V_X$ and the estimated power delivered to load 112. In at least one embodiment, the control signal period generation strategy module 802 generates TT as a function of both the primary supply voltage $V_X$ and the estimated power delivered to load 112.

The PFC and output voltage controller 800 determines the period TT and pulse width T1 of switch control signal $CS_1$ to, for example, provide power transfer efficiency and power factor correction for switching power converter 402. In at least one embodiment, the estimated power delivered to load 112 is represented by "K", the output value of load power demand estimator 803 in the voltage control loop 418. In at least one embodiment, the square of the pulse width period T1, i.e. $T1^2$, is determined in accordance with Equation 1:

$$T1^2 = \frac{2 \cdot L}{V_{X\_RMS}^2} \cdot K \cdot TT \cdot \left(1 - \frac{V_x}{V_c}\right) \qquad 1$$

"T1" is the pulse width (on-time) of the control signal $CS_1$. "L" represents an inductor value of inductor 110. $V_{X\_RMS}$ represents the primary supply RMS voltage $V_{X\_RMS}$. "K" represents an estimate of the power demand of load 112 as determined by load power demand estimator 803. "TT" is the period of control signal $CS_1$ as generated by control signal period generation strategy module 802. "$V_X$" is a sampled value of the current value of primary supply voltage $V_X$. "$V_C$" is a sampled value of the output voltage $V_C$. In the preferred embodiment, this calculation will be performed in fixed-point arithmetic with appropriately scaled values and work lengths.

The RMS value generator 804 determines primary supply RMS voltage $V_{X\_RMS}$ from a sampled primary supply voltage $V_X$. Module 806 receives the primary supply RMS voltage $V_{X\_RMS}$ value and determines $2 \cdot L/(V_{X\_RMS}^2)$. "$2 \cdot L/(V_{X\_RMS}^2)$" represents a scaling factor. Boost factor module 808 determines a boost factor $(1-V_X/V_C)$. Multiplier 810 multiplies switch control signal $CS_1$, period TT, the output value of module 806, the output value of boost factor module 808, and estimated power demand K to generate $T1^2$. Nonlinear delta-sigma modulator 812 determines the pulse width T1 of switch control signal $CS_1$. Pulse width modulator (PWM) 814 receives the pulse width T1 and period TT and generates switch control signal $CS_1$ so that switch control signal $CS_1$ has a pulse width T1 and a period TT.

In at least one embodiment, to ensure that switching power converter 402 operates in DCM, the value L of inductor 110 is set in accordance with Equation [2]:

$$L = V_{min}^2 \bigg/ \left[ (P_{max} \cdot J) \cdot (2 \cdot f_{max}) \cdot \left[1 - \sqrt{2}\left(\frac{V_{min}}{V_{cap}}\right)\right]\right]. \qquad [2]$$

"L" is the value of the inductor 110. "$V_{min}$" is the minimum expected primary supply RMS voltage $V_{X\_RMS}$. "$P_{max}$" is the maximum power demand of load 112. "J" is an overdesign factor and any value greater than 1 indicates an overdesign. In at least one embodiment, "J" is 1.1. "$f_{max}$" is a maximum frequency of control signal $CS_1$. "$V_C$" is a nominal expected output voltage $V_C$. The flyback time T2 can be determined in accordance with Equation [3]:

$$T2 = \frac{V_X}{V_C - V_X}. \quad [3]$$

In at least one embodiment, to avoid saturation of inductor 110, the value L of inductor 110 is chosen so that a peak inductor current, $i_L$ PEAK is greater than or equal to the greatest value of $V_X \cdot T1/L$. Generally, the peak inductor current $i_L$ PEAK occurs at full output power at the peak of primary supply voltage $V_X$ during low line voltage operation.

The efficient control signal period generation strategy used by PFC and output voltage controller 406 to determine a period of the switch control signal $CS_1$ is a matter of design choice and can be set to optimize to the efficiency of switching power converter 402.

Additionally, in at least one embodiment, the range of possible primary supply voltage levels also influences the time of period TT. For example, to remain in DCM operation, the period TT is increased for high line voltage conditions in order to remain in DCM operation.

FIGS. 9-13 depict exemplary efficient period-instantaneous primary supply voltage $V_X$ correlation strategies. The particular strategy used to provide an efficient period-instantaneous primary supply voltage $V_X$ correlation depends on a number of operational factors such as the component values of a power control system, such as power control system 400, operational frequencies, and power delivered to load 112. FIGS. 9-13 illustrate a variety of strategies that provide efficient period-instantaneous primary supply voltage $V_X$ correlation. Other period-instantaneous primary supply voltage $V_X$ correlation strategies that inversely relate a trend of the switch control signal $CS_1$ period and the instantaneous primary supply voltage $V_X$ can be used is a matter of design choice based, for example, on operational parameters of a power control system.

Figure 9:
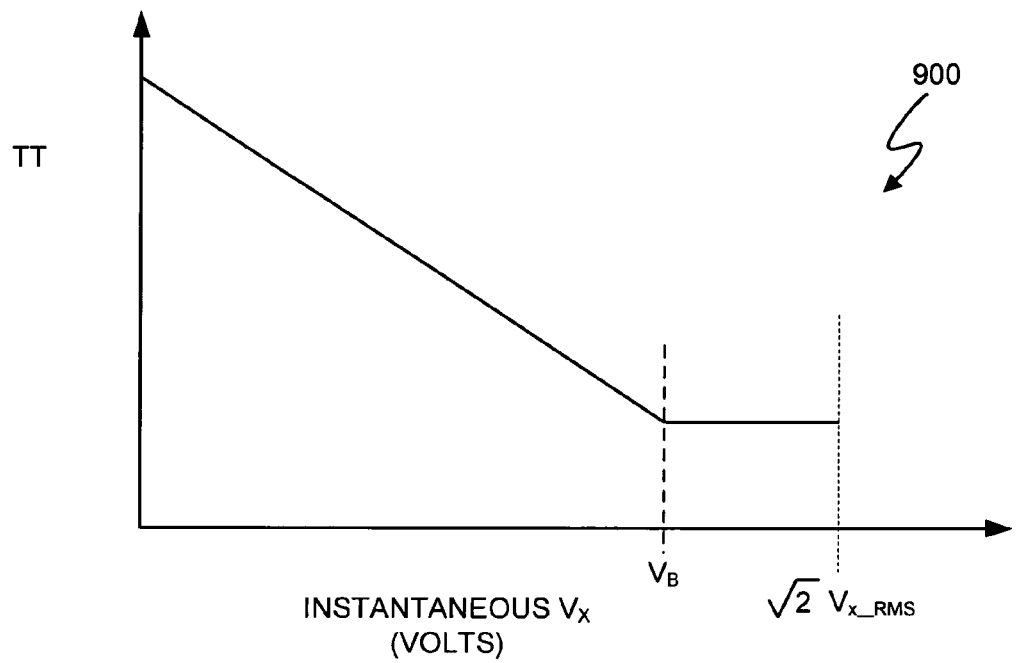
FIGS. 9-13 depict efficient period-instantaneous primary supply voltage $V_X$ correlation strategies.

FIG. 9 depicts efficient period-instantaneous primary supply voltage $V_x$ correlation strategy 900. The period TT decreases linearly from primary supply voltage $V_X$ equal to 0 to primary supply voltage $V_X$ equal to $0.75\sqrt{2} \cdot V_{X\_RMS}$ and remains constant until primary supply voltage $V_X$ equals $\sqrt{2} \cdot V_{X\_RMS}$. The constant period TT above voltage $V_B$ sets an upper limit on the switching frequency of switch control signal $CS_1$ to, for example, prevent excessive switching losses of switch 108.

Figure 10:
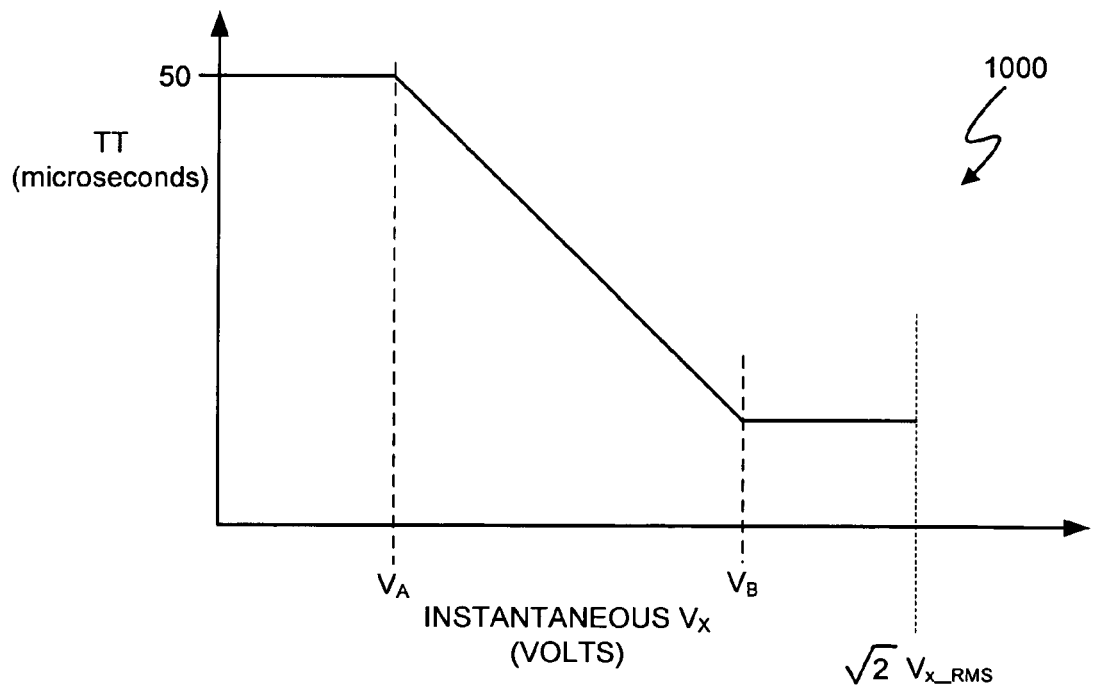

FIG. 10 depicts efficient period-instantaneous primary supply voltage $V_X$ correlation strategy 1000. The efficient period-instantaneous primary supply voltage $V_X$ correlation strategy 1000 maintains a constant switch control signal $CS_1$ period TT until primary supply RMS voltage $V_{X\_RMS}$ equals $0.25\sqrt{2}\sqrt{V_{X\_RMS}}$, decreases linearly thereafter until primary supply RMS voltage $V_{X\_RMS}$ equals $0.75\sqrt{2} \cdot V_{X\_RMS}$, and then remains constant until primary supply RMS voltage $V_{X\_RMS}$ equals $\sqrt{2} \cdot V_{X\_RMS}$. The constant period TT above voltage $V_A$ sets an upper limit for the switching frequency of switch control signal $CS_1$ to, for example, prevent excessive switching losses of switch 108. The constant period TT below voltage $V_B$ sets a lower limit on the switching frequency of switch 108 to, for example, avoid frequencies in a human audible frequency band.

Figure 11:
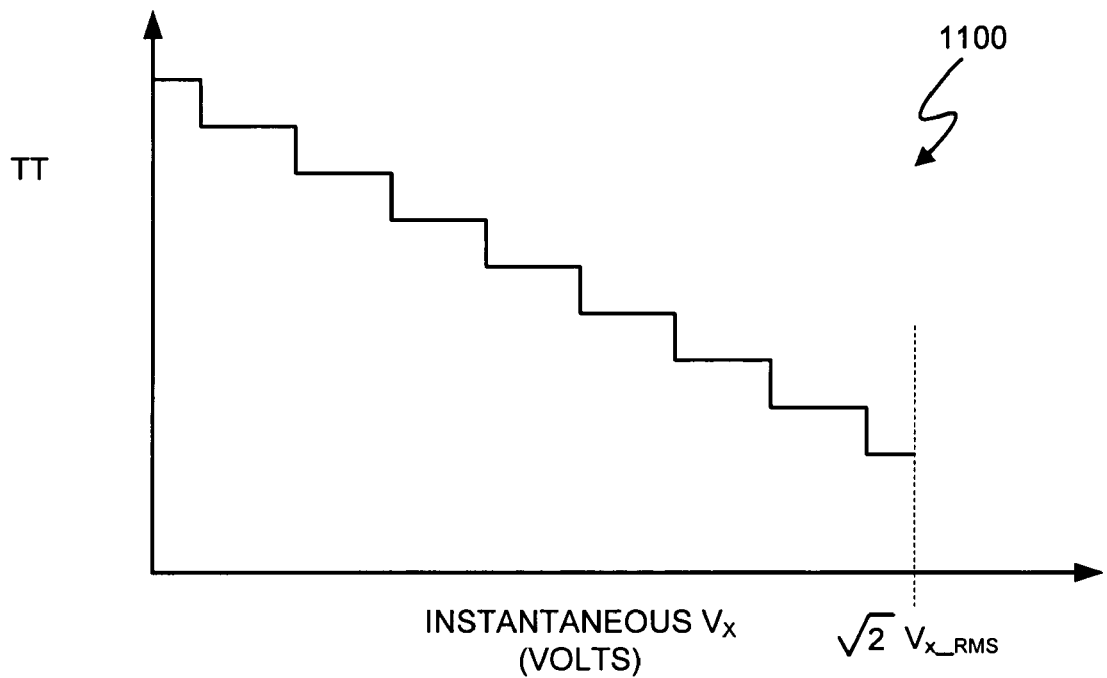

FIG. 11 depicts efficient period-instantaneous primary supply voltage $V_X$ correlation strategy 1100. The efficient period-instantaneous primary supply voltage $V_X$ correlation strategy 1100 is a step function, and, thus, period TT need only be determined upon the transition from step to step.

Figure 12:
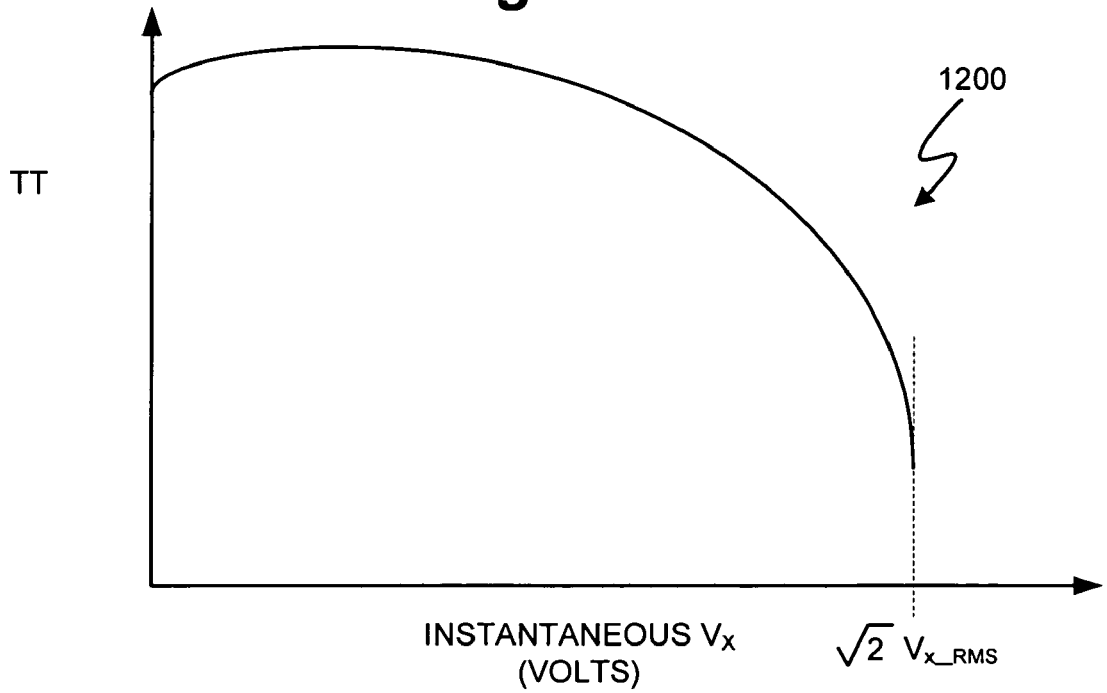

FIG. 12 depicts efficient period-instantaneous primary supply voltage $V_X$ correlation strategy 1200. The efficient period-instantaneous primary supply voltage $V_X$ correlation strategy 1200 initially increases as primary supply RMS voltage $V_X$ RMS increases from 0 and then nonlinearly decreases as primary supply voltage $V_X$ approaches $\sqrt{2} \cdot V_{X\_RMS}$. Even though efficient period-instantaneous primary supply voltage $V_X$ correlation strategy 1200 briefly increases, efficient period-instantaneous primary supply voltage $V_X$ correlation strategy 1200 causes the period TT of the switch control signal $CS_1$ to trend inversely to the instantaneous primary supply voltage $V_X$. In at least one embodiment, the efficient period-instantaneous primary supply voltage $V_X$ correlation strategy 1200 causes the inductor 110 to get close to saturation.

Figure 13:
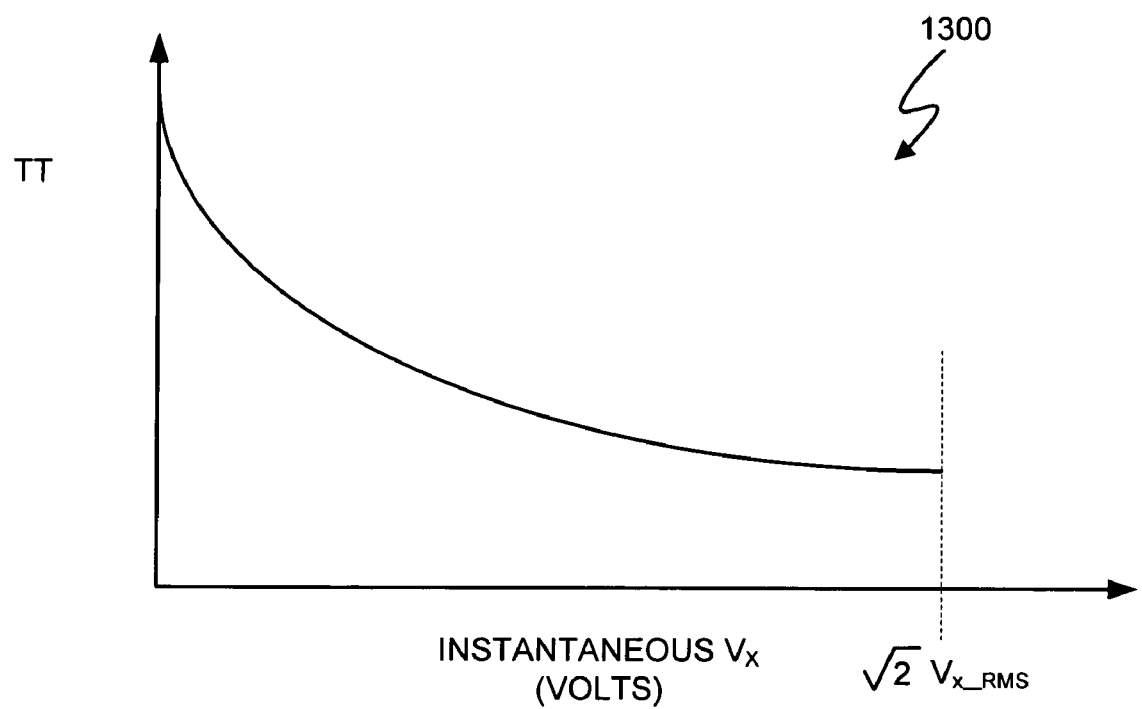

FIG. 13 depicts efficient period-instantaneous primary supply voltage $V_X$ correlation strategy 1300. The efficient period-instantaneous primary supply voltage $V_X$ correlation strategy 1300 generally follows a decreases quadratically until primary supply voltage $V_X$ equals $\sqrt{2} \cdot V_{X\_RMS}$.

The particular period-power transfer correlation strategy used by efficient control signal period generator 408 is a matter of design choice and can be tailored to meet, for example, efficiency, power factor correction, computation complexity, and component characteristics. In the preferred embodiment, period generator 408 is implemented in digital logic and receives digitized representations of input values. The efficient control signal period generator 408 can generate the switch control signal $CS_1$ period TT in any of a number of ways. For example, the period-instantaneous primary supply voltage $V_X$ strategy used by control signal period generation strategy module 802 can be stored as an algorithm, and control signal period generation strategy module 802 can determine the switch control signal $CS_1$ period TT in accordance with the algorithm. In another embodiment, the period-power transfer correlation strategy can be stored in an optional memory 816. In at least one embodiment, the memory 816 includes a look-up table that correlates values of the period TT and values of primary supply voltage $V_X$. The control signal period generation strategy module 802 can then retrieve the value of period TT based on the value of primary supply voltage $V_X$.

In at least one embodiment, the PFC and output voltage controller 800 is implemented as a programmable PFC and output voltage controller as described in U.S. patent application Ser. No. 11/967,275, entitled "Programmable Power Control System", filing date Dec. 31, 2007, assignee Cirrus Logic, Inc., and inventor John L. Melanson. U.S. patent application Ser. No. 11/967,275 includes exemplary systems and methods and is herby incorporated by reference in its entirety. As the optimum period depends upon the design choice of switching components, allowing programmability of the efficient period control algorithm allows each design to be optimized for efficiency while utilizing the same integrated circuit embodiment of PFC and output voltage controller 800.

Figure 14:
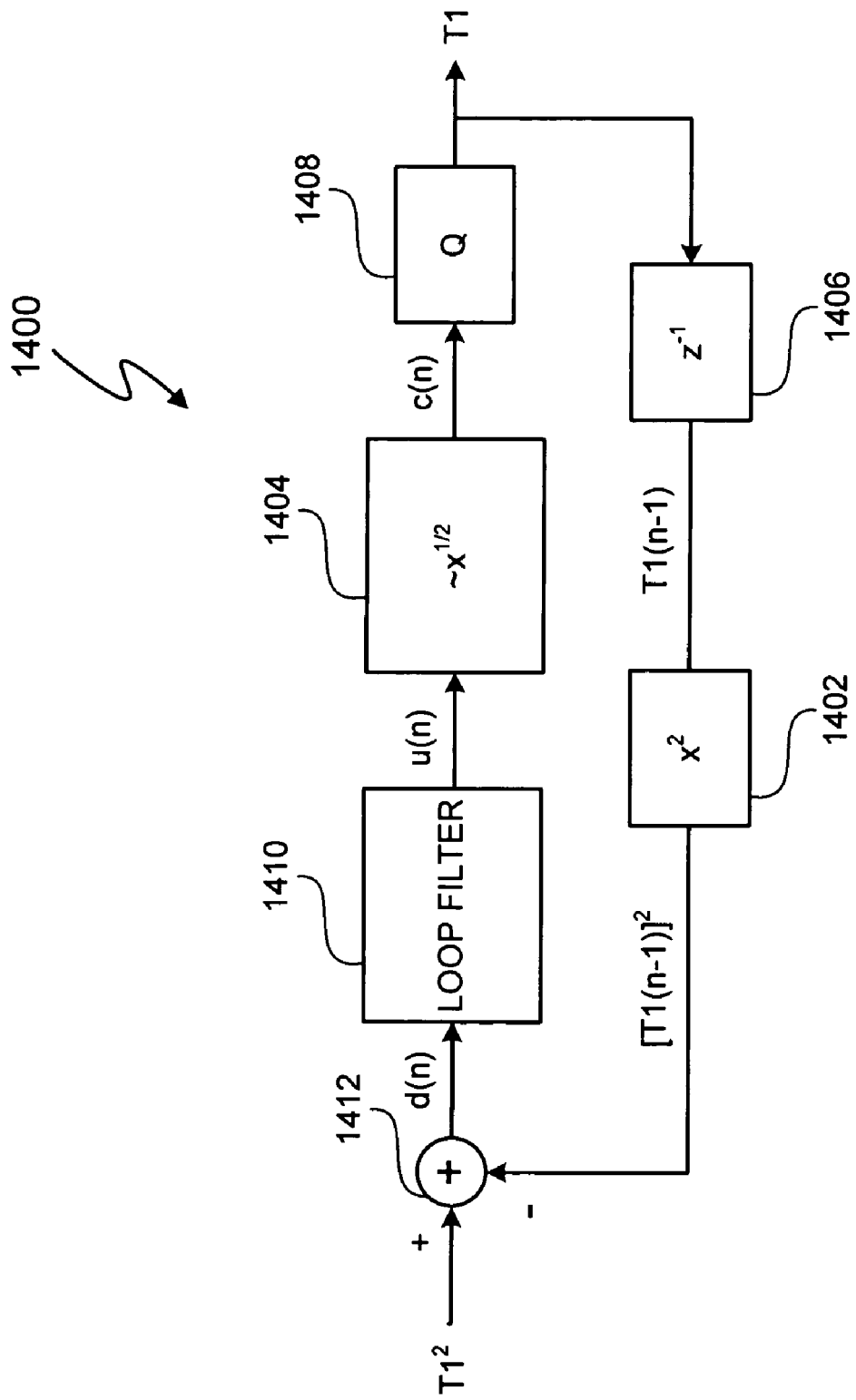
FIG. 14 depicts a nonlinear delta-sigma modulator.

FIG. 14 depicts nonlinear delta-sigma modulator 1400, which represents one embodiment of nonlinear delta-sigma modulator 812. The nonlinear delta-sigma modulator 1400 models a nonlinear power transfer process of switching power converter 402. The nonlinear power transfer process of switching power converter 402 can be modeled as a square function, $x^2$. Nonlinear delta-sigma modulator 1400 includes a nonlinear system feedback model 1402 represented by $x^2$. The output of feedback model 1402 is the square of delay-by-one quantizer output signal T1, i.e. $[T1(n-1)]^2$. Delay $z^{-1}$ 1406 represents a delay-by-one of quantizer output signal T1. Negative $[T1(n-1)]^2$ is added to $T1^2$ by adder 1412. The nonlinear delta-sigma modulator 1400 includes a compensation module 1404 that is separate from quantizer 1408. The nonlinearity compensation module 1404 processes output signal u(n) of the loop filter 1410 with a square root function $x^{1/2}$ to compensate for nonlinearities introduced by the nonlinear feedback model 1402. The output c(n) of compensation module 1404 is quantized by quantizer 1408 to generate pulse width T1 for switch control signal $CS_1$.

Figure 15:
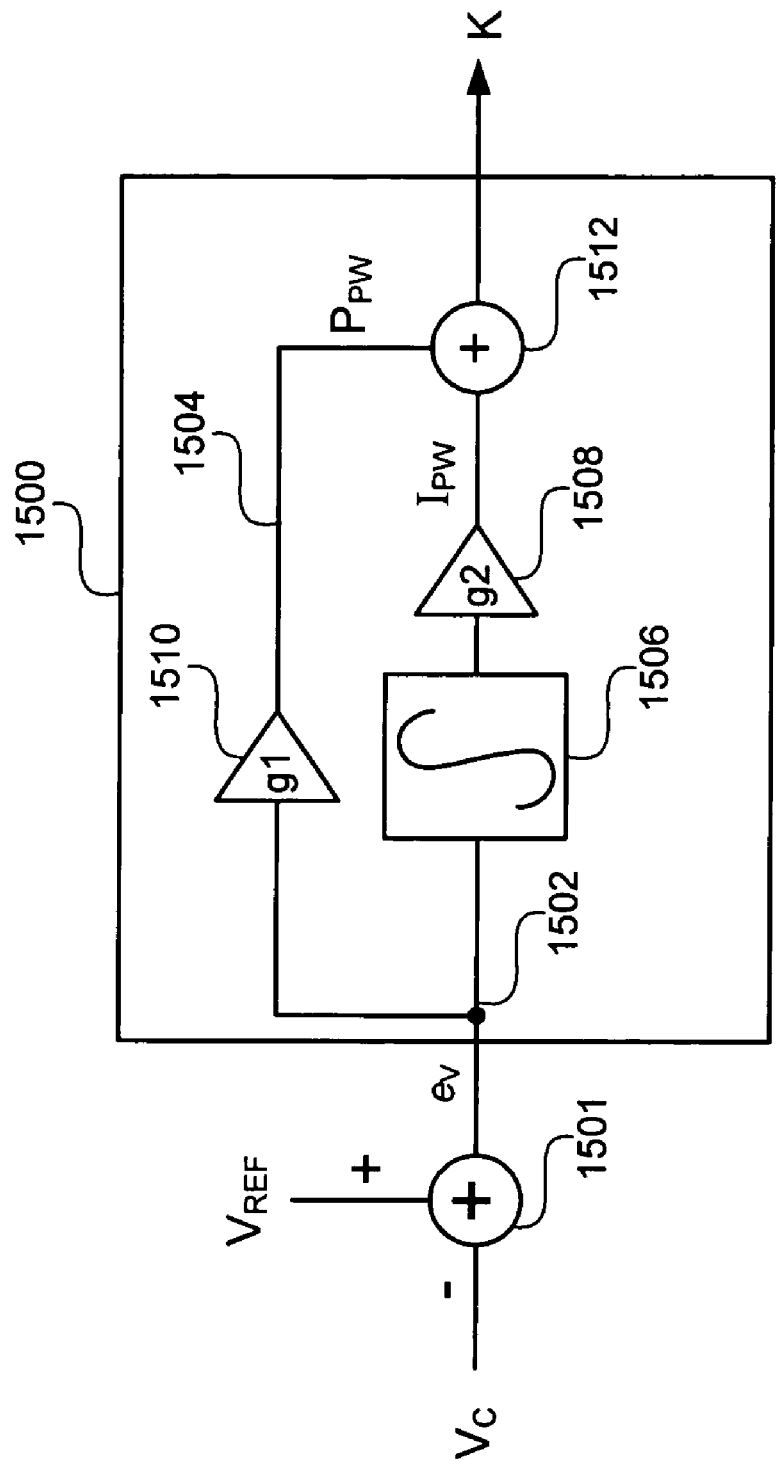
FIG. 15 depicts a proportional integrator.

FIG. 15 depicts a proportional integrator (PI) compensator 1500, which represents one embodiment of load power demand estimator 803. The PI compensator 1500 generates the load power demand signal K. The load power demand signal K varies as the difference between a reference voltage $V_{REF}$ and the output voltage $V_C$, as represented by error signal $e_v$, from error generator 1501, varies. The reference signal $V_{REF}$ is set to a desired value of output voltage $V_C$. The PI compensator 1500 includes an integral signal path 1502 and a proportional signal path 1504. The integral signal path 1502 includes an integrator 1506 to integrate the error signal $e_v$, and a gain module 1508 to multiply the integral of error signal $e_v$ by a gain factor g2 and generate the integrated output signal $I_{PW}$. The proportional path 1504 includes a gain module 1510 to multiply the error signal $e_v$ by a gain factor g1 and generate the proportional output signal $P_{PW}$. Adder 1512 adds the integrated output signal $I_{PW}$ and the proportional output signal $P_{PW}$ to generate the load power demand signal K.

The values of gain factors g1 and g2 are a matter of design choice. The gain factors g1 and g2 affect the responsiveness of PFC and output voltage controller 406. Exemplary values of gain factors g1 and g2 are set forth in the emulation code of FIGS. 8-31 of U.S. patent application Ser. No. 11/967,269, entitled "Power Control System Using a Nonlinear Delta-Sigma Modulator with Nonlinear Power Conversion Process Modeling", filed Dec. 31, 2007, assignee Cirrus Logic, Inc., and inventor John L. Melanson. U.S. patent application Ser. No. 11/967,269 describes exemplary systems and methods and is incorporated herein by reference in its entirety. Faster response times of the PFC and output voltage controller 406 allow the switch control signal $CS_1$ to more rapidly adjust to minimize the error signal $e_v$. If the response is too slow, then the output voltage $V_C$ may fail to track changes in power demand of load 112 and, thus, fail to maintain an approximately constant value. If the response is too fast, then the output voltage $V_C$ may react to minor, brief fluctuations in the power demand of load 112. Such fast reactions could cause oscillations in PFC and output voltage controller 406, damage or reduce the longevity of components, or both. The particular rate of response by proportional integrator 1500 is a design choice.

FIGS. 16 and 17 depict respective exemplary embodiments of RMS value generator 804. The RMS value of primary supply voltage $V_X$ is the square root of the average of the squares of primary supply voltage $V_X$. RMS value generator 1600 receives a set $\{V_X\}$ samples of primary supply voltage $V_X$ during a cycle of primary supply voltage $V_X$ and squaring module 1602 squares each sample of primary supply voltage to determine a set $\{V_X^2\}$. Low pass filter 1604 determines a mean $V_X^2{}_{\_MEAN}$ of the set $\{V_X^2\}$. Square root module 1606 determines the square root of $V_X^2{}_{\_MEAN}$ to determine the primary supply RMS voltage $V_{X\_RMS}$.

The RMS value generator 1700 receives the primary supply voltage $V_X$ and peak detector 1702 determines a peak value $V_{X\_PEAK}$ of primary supply voltage $V_X$. Since primary supply voltage $V_X$ is a sine wave in at least one embodiment, multiplying $V_{X\_PEAK}$ by $\sqrt{2}/2$ with multiplier 1704 generates primary supply RMS voltage $V_{X\_RMS}$. In at least one embodiment, as the exact value of $V_{X\_PEAK}$ is not critical, the determination of $V_{X\_PEAK}$ by RMS value generator 1700 is generally adequate.

Figure 18:
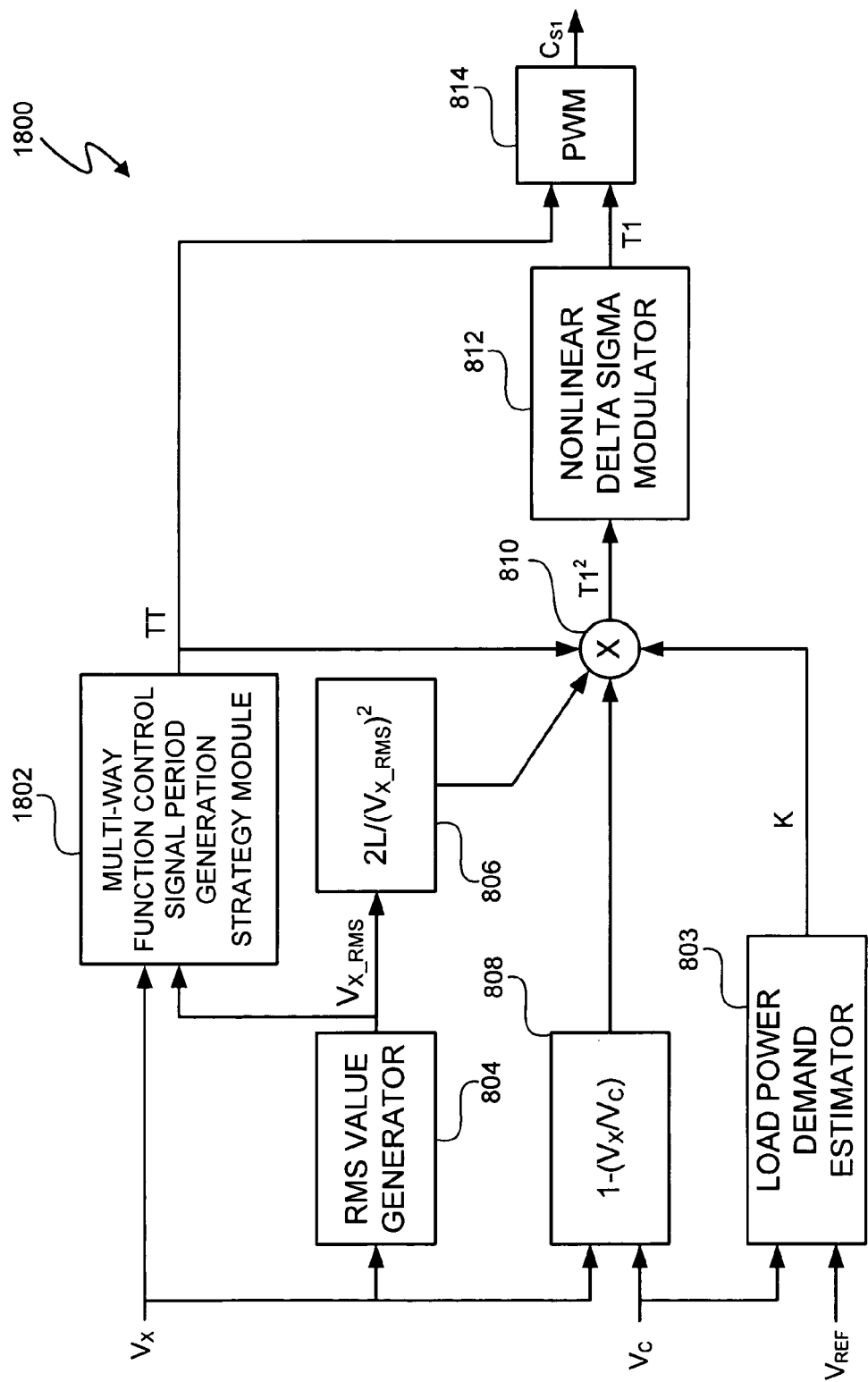
FIG. 18 depicts another embodiment of a PFC and output voltage controller of the power control system of FIG. 4.

FIG. 18 depicts a PFC and output voltage controller 1800 that represents one embodiment of PFC and output voltage controller 406. In at least one embodiment, multi-way function control signal period generation strategy module 1802 determines the period TT of switch control signal $CS_1$ as a one-way, two-way, or three-way function of the Period Determination Variables. As primary supply RMS voltage $V_{X\_RMS}$ increases the average input current, and hence the average inductor current $i_L$ required to supply a given amount of power decreases. For example, for primary supply RMS voltage $V_{X\_RMS}=120V$, to supply 30 watts of power, the input equals 250 mA, i.e. $P=V \cdot I$. For primary supply RMS voltage $V_{X\_RMS}=240V$, to supply 30 watts of power, the RMS inductor current $i_{L\_RMS}$ equals 125 mA. Thus, the period TT of switch control signal $CS_1$ can be increased with increasing values of primary supply RMS voltage $V_{X\_RMS}$, which decreases the frequency of switch control signal $CS_1$. Decreasing the frequency of switch control signal $CS_1$ increases the efficiency of power control system 400. In at least one embodiment, PFC and output voltage controller 1800 functions the same way as PFC and output voltage controller 800 except the strategy module 1802 determines the period TT of switch control signal $CS_1$ as a one-way, two-way, or three-way function of the Period Determination Variables.

Figure 19:
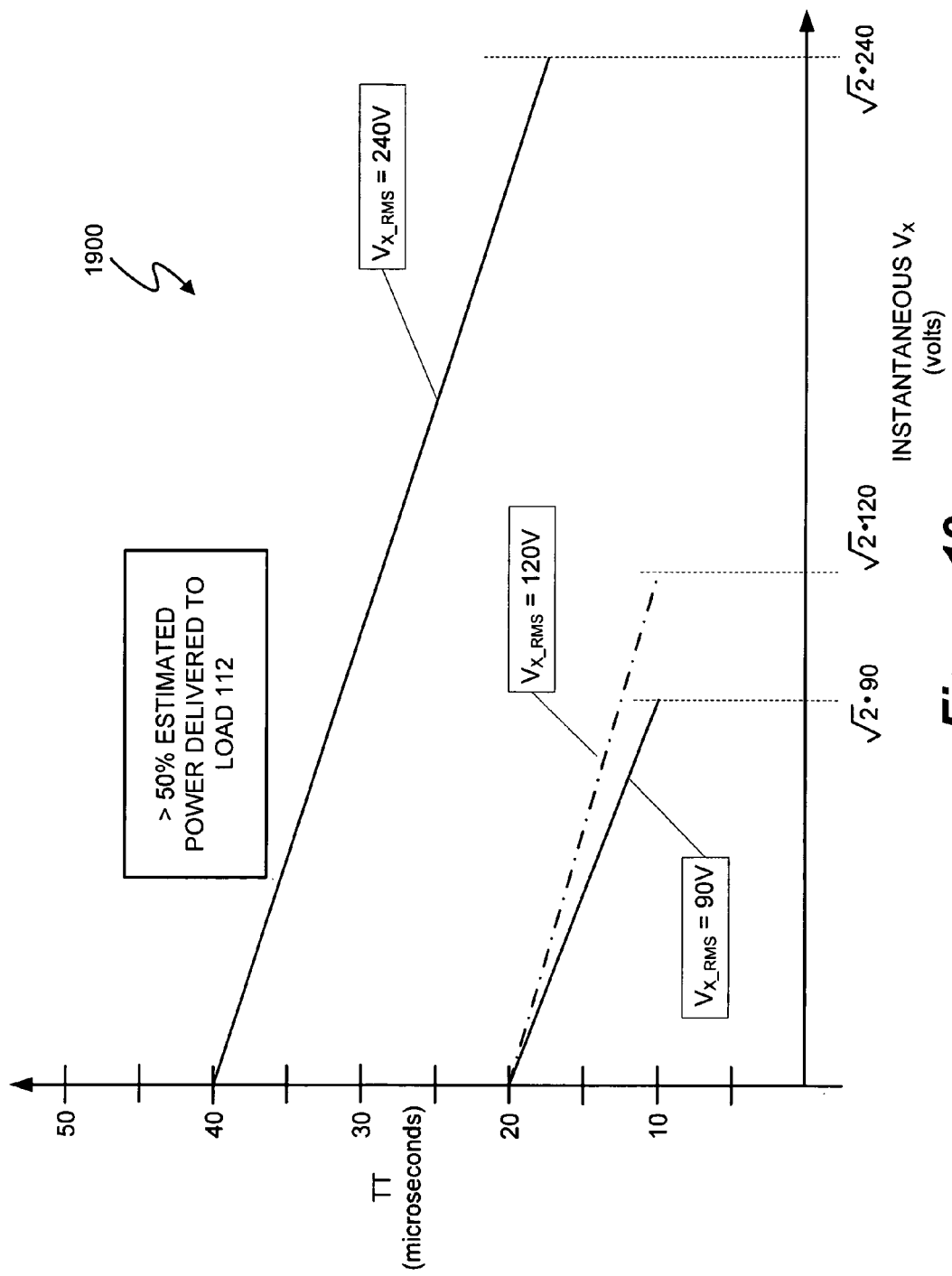
FIGS. 19-21 depict efficient period-power transfer-instantaneous primary supply voltage correlation strategies for multiple primary supply RMS voltages and multiple power transfer percentages.
Figure 20:
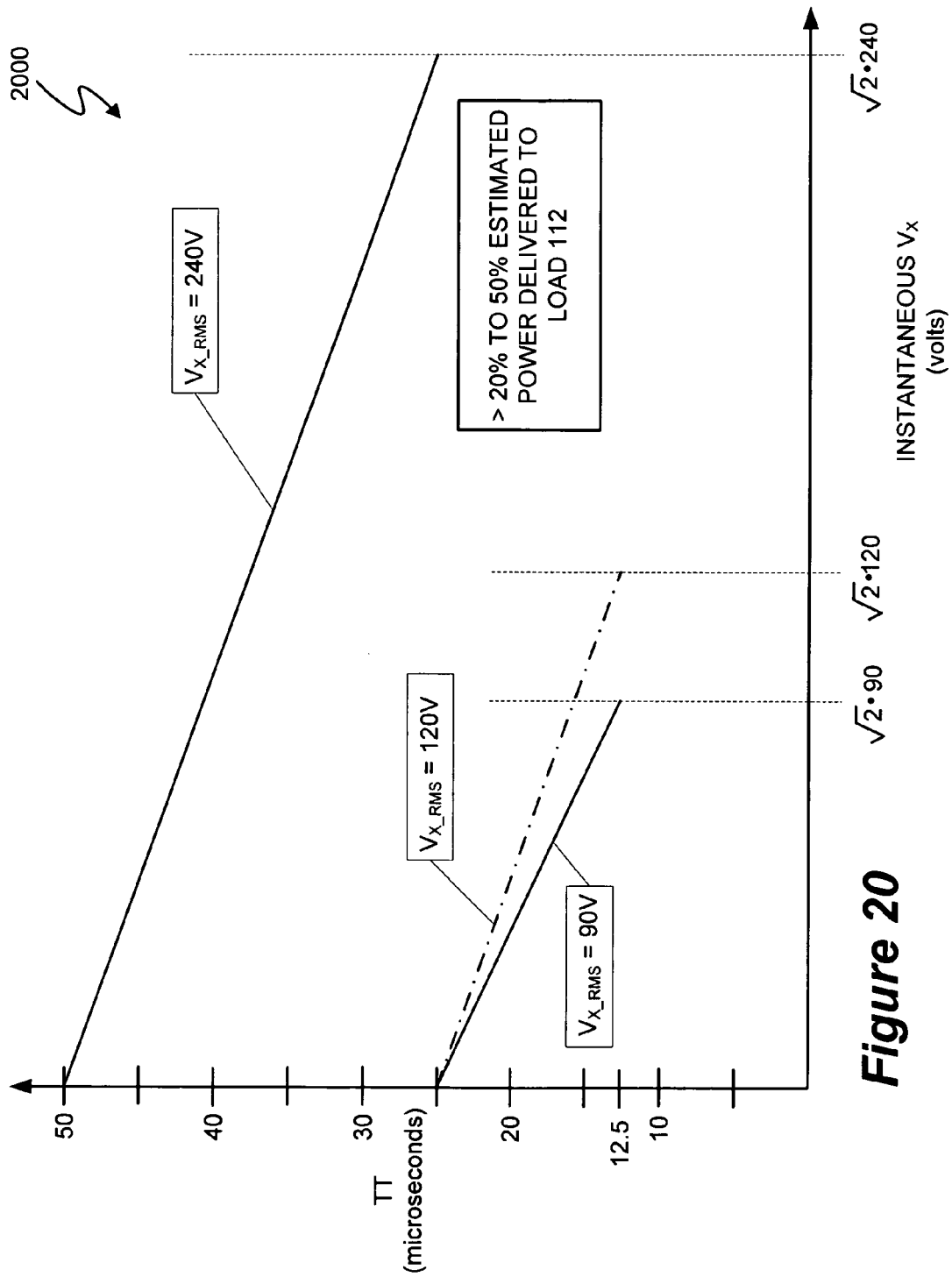
Figure 21:
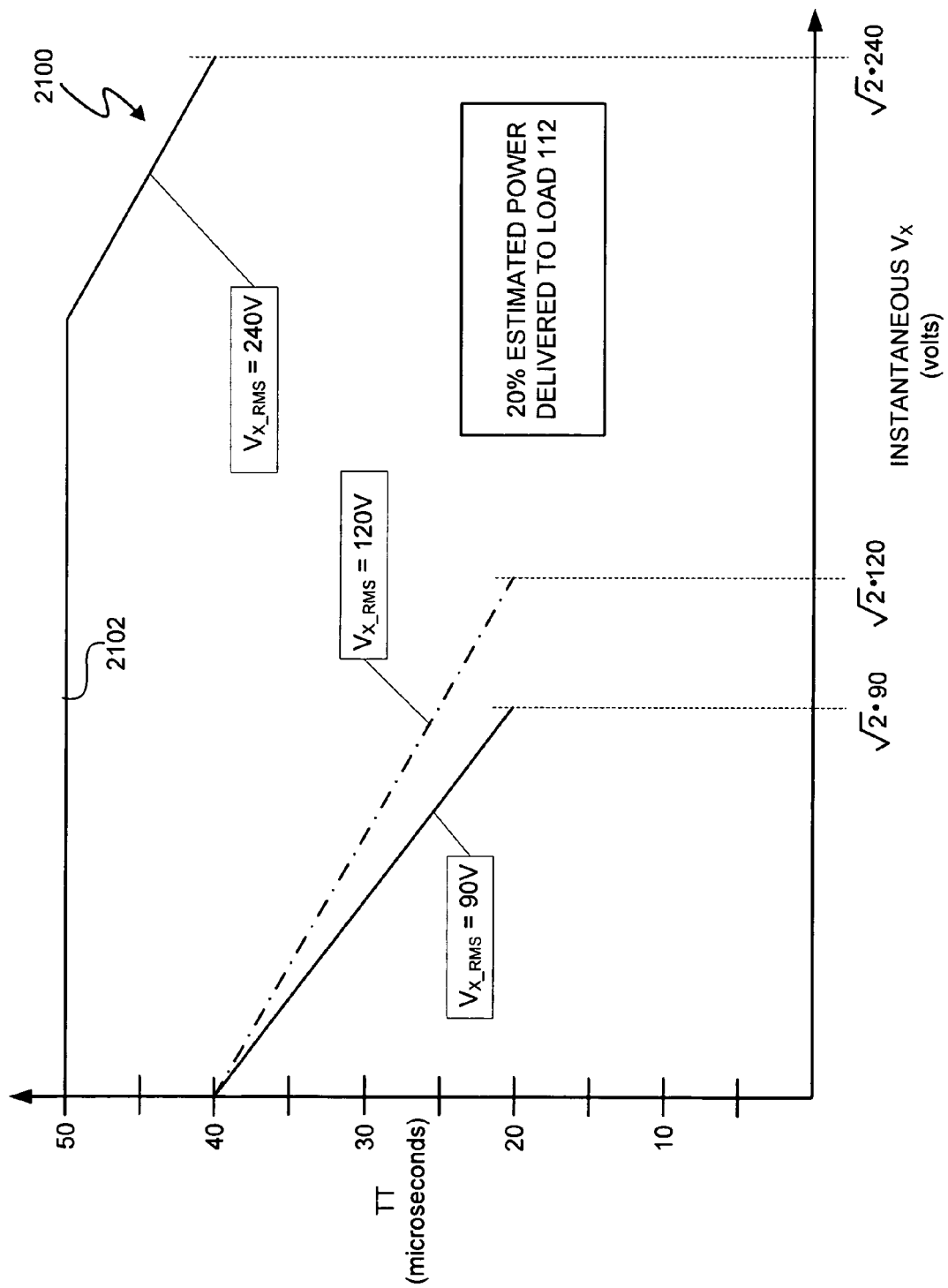

FIGS. 19, 20, and 21 depict respective efficient period determination strategies 1900, 2000, and 2100 represents a three-way function of the Period Determination Variables. The three-way function" indicates that all three of the Period Determination Variables are used to determine the period TT of switch control signal $CS_1$. Referring to FIG. 19, the estimated power delivered to load 112 is greater than half (>50%) of a maximum deliverable power to load 112. As the value of primary supply RMS voltage $V_{X\_RMS}$ increases, period determination strategy 1900 increases the value of period TT for a given primary supply RMS voltage $V_{X\_RMS}$ value. Additionally, the period TT also trends inversely relative to the instantaneous primary supply voltage $V_X$. The period determination strategy 1900 represents one embodiment of an efficient period determination strategy that can be utilized by the $V_{X\_RMS}$ based efficient control signal period generation strategy module 1802. The period-power transfer correlation strategies of FIGS. 10-13 can also be utilized by $V_X$ RMS based efficient control signal period generation strategy module 1802 by increasing the period TT of switch control signal $CS_1$ with increasing values of primary supply RMS voltage $V_{X\_RMS}$.

FIG. 20 depicts an efficient period determination strategy 2000 that represents a three-way function of the Period Determination Variables. The estimated power delivered to load 112 ranges from greater than 20% to 50% of a maximum deliverable power to load 112. As the value of primary supply RMS voltage $V_{X\_RMS}$ increases, period determination strategy 2000 increases the value of period TT for a given primary supply RMS voltage $V_{X\_RMS}$ value. Additionally, the period TT also trends inversely relative to the instantaneous primary supply voltage $V_X$. The period determination strategy 2000 represents one embodiment of an efficient period determination strategy that can be utilized by the $V_{X\_RMS}$ based efficient control signal period generation strategy module 1802. The period-power transfer correlation strategies of FIGS. 10-13 can also be utilized by $V_{X\_RMS}$ based efficient control signal period generation strategy module 1802 by increasing the period TT of switch control signal $CS_1$ with increasing values of primary supply RMS voltage $V_{X\_RMS}$.

FIG. 21 depicts an efficient period determination strategy 2100 that represents a three-way function of the instantaneous voltage levels of the Period Determination Variables. The estimated power delivered to load 112 ranges from 0% to 20% of a maximum deliverable power to load 112. As the value of primary supply RMS voltage $V_{X\_RMS}$ increases, period determination strategy 2000 increases the value of period TT for a given primary supply RMS voltage $V_{X\_RMS}$ value. For primary supply RMS voltage $V_{X\_RMS}$ equal to 240V, if the relationship between period TT and the instantaneous primary supply voltage $V_X$ at $\sqrt{2} \cdot 240$ at a constant rate as primary supply RMS voltage $V_{X\_RMS}$ decreased, the period TT would be 80 micro seconds at instantaneous primary supply voltage $V_X$ equal 0 V. However, to keep the frequency of switch 108 above 20 kHz, the upper limit of the human audible frequency band, period determination strategy 2100 limits a maximum period TT to 50 micro seconds, i.e. 20 kHz. Additionally, the period TT also trends inversely relative to the instantaneous primary supply voltage $V_X$. The period determination strategy 2100 represents one embodiment of an efficient period determination strategy that can be utilized by the $V_{X\_RMS}$ based efficient control signal period generation strategy module 1802. The period-power transfer correlation strategies of FIGS. 10-13 can also be utilized by $V_{X\_RMS}$ based efficient control signal period generation strategy module 1802 by increasing the period TT of switch control signal $CS_1$ with increasing values of primary supply RMS voltage $V_{X\_RMS}$.

FIGS. 19-21 taken together depict an exemplary function of the period of the switch control signal switch control signal $CS_1$ trending inversely to estimated power delivered to load 112. Although a particular embodiment of the estimated power delivered to load 112 and the period TT of switch control signal $CS_1$ is depicted, the particular relationship where the period TT of switch control signal $CS_1$ varies inversely to the estimated power delivered to load 112 is a matter of design choice. Additionally, FIGS. 19-21 can be used to as a two-way function of (i) the primary supply voltage $V_X$ and (ii) the primary supply RMS voltage $V_{X\_RMS}$, while providing power factor correction (PFC) if the estimated power delivered to load 112 is held constant. Additionally, FIGS. 19-21 can be used as a one-way function of the primary supply RMS voltage $V_{X\_RMS}$, while providing power factor correction (PFC) by using only inverse relationships between the primary supply RMS voltage $V_{X\_RMS}$ and the period TT of switch control signal $CS_1$.

Thus, PFC and output voltage controller 406 achieves an efficient correlation between the switching period with associated switching losses and (i) the instantaneous power transferred to the switching power converter, (ii) the primary supply voltage $V_X$, and/or (iii) the primary supply RMS voltage $V_{X\_RMS}$, while providing power factor correction (PFC).

Although the present invention has been described in detail, it should be understood that various changes, substitutions and alterations can be made hereto without departing from the spirit and scope of the invention as defined by the appended claims.

What is claimed is:

1. A system comprising:
a controller to generate a switch control signal to control conductivity of a switch included in a switching power converter, wherein controlling conductivity of the switch causes an input current to the switching power converter to vary in approximate proportion to a time varying voltage source signal supplied to the switching power converter, wherein the controller comprises:
a period generator to determine a period of the switch control signal so that the period of the switch control signal varies in accordance with at least one of:
(i) the period of the switch control signal trends inversely to estimated power delivered to a load coupled to the switching power converter;
(ii) the period of the switch control signal trends inversely to instantaneous voltage levels of the time-varying voltage source signal; and
(iii) the period of the switch control signal trends directly with a line voltage level of the time-varying voltage source signal; and
a pulse width generator to determine a pulse width of the switch control signal in response to at least one of: (i) the determined period of the switch control signal, (ii) the instantaneous voltage levels of the voltage source signal, and (iii) a voltage level of the output voltage signal of the switching power converter.

2. The system of claim 1 further comprising:
an input to receive the time-varying voltage source signal from a voltage source; and
the switching power converter, coupled to the controller, to convert the voltage source signal into an output voltage signal, the switching power converter comprising the switch to control power transfer from the voltage source to the switching power converter wherein the switching power further comprises an inductor coupled between the input and the switch and further comprises an output, wherein the switch causes a transfer of power from the voltage source to the inductor when the switch conducts and the switch causes a transfer of power to the load when the switch is nonconductive.

3. The system of claim 1 wherein the period generator is configured to determine a period of the switch control signal so that the period of the switch control signal varies in accordance with at least two of:
(i) the period of the switch control signal trends inversely to estimated power delivered to a load coupled to the switching power converter;
(ii) the period of the switch control signal trends inversely to instantaneous voltage levels of the voltage source signal; and
(iii) the period of the switch control signal trends directly with voltage levels of the time-varying voltage source signal.

4. The system of claim 1 wherein the period generator is configured to determine a period of the switch control signal so that the period of the switch control signal varies in accordance with:
(i) the period of the switch control signal trends inversely to estimated power delivered to a load coupled to the switching power converter;
(ii) the period of the switch control signal trends inversely to instantaneous voltage levels of the voltage source signal; and
(iii) the period of the switch control signal trends directly with the line voltage level of the time-varying voltage source signal.

5. The system of claim 1 wherein the trend of the period of the switch with respect to instantaneous voltage levels of the voltage source signal is linear.

6. The system of claim 1 wherein the trend of the period of the switch with respect to instantaneous voltage levels of the voltage source signal is non-linear.

7. The system of claim 1 wherein the trend of the period of the switch with respect to instantaneous voltage levels of the voltage source signal is based on a piece-wise linear step function.

8. The system of claim 1 wherein, for a 180 degree half-cycle of the time-varying voltage source signal, the switch control signal comprises multiple cycles and less than 50% of the cycles of the switch control signal occur when a magnitude of the time varying voltage source signal is less than a root mean square of the time varying voltage source signal.

9. The system of claim 1 wherein the controller further comprises:
an analog-to-digital voltage level detector to detect a value of the time-varying voltage source signal; and
the period generator comprises a function generator, coupled to the voltage level detector, to receive a digital detected voltage level value and generate a digital period control signal to control the period of the switch control signal.

10. The system of claim 9 wherein the function generator is configured to generate the period of the control signal as a function of estimated power delivered to a load coupled to the switching power converter, the instantaneous voltage levels of the voltage source signal, and the line voltage level of the time-varying voltage source signal.

11. The system of claim 1 wherein the line voltage level of the time-varying voltage source signal is represented as one of the members of a group consisting of: a root mean square value, an average value, and a peak value of the time-varying voltage source signal.

12. The system of claim 1 wherein a maximum period of the switch control signal differs from a minimum period of the switch control signal by a ratio of at least 2:1.

13. A method comprising:
generating a switch control signal to control conductivity of a switch included in a switching power converter, wherein controlling conductivity of the switch causes an input current to the switching power converter to vary in approximate proportion to a time varying voltage source signal supplied to the switching power converter;
determining a period of the switch control signal so that the period of the switch control signal varies in accordance with at least one of:
    (i) the period of the switch control signal trends inversely to estimated power delivered to a load coupled to the switching power converter;
    (ii) the period of the switch control signal trends inversely to instantaneous voltage levels of the voltage source signal; and
    (iii) the period of the switch control signal trends directly with a line voltage level of the time-varying voltage source signal;
determining a pulse width of the switch control signal in response to at least one of: (i) the determined period of the switch control signal, (ii) the instantaneous voltage levels of the voltage source signal, and (iii) a voltage level of the output voltage signal of the switching power converter; and
providing the switch control signal to the switching power converter.

14. The method of claim 13 further comprising:
receiving the time-varying voltage source signal from a voltage source;
receiving a sample of the instantaneous voltage level of the voltage source signal;
receiving a sample of the voltage level of the output voltage signal of the switching power converter;
converting the voltage source signal into an output voltage signal; and
supplying the output voltage signal to the load.

15. The method of claim 13 further comprising:
causing the switch to conduct during each period of the control signal in accordance with the pulse width of the switch control signal; and
causing the switch to be nonconductive during a remaining time of each period.

16. The method of claim 13 wherein determining a period of the switch control signal comprises determining a period of the switch control signal so that the period of the switch control signal varies in accordance with at least two of:
    (i) the period of the switch control signal trends inversely to estimated power delivered to a load coupled to the switching power converter;
    (ii) the period of the switch control signal trends inversely to instantaneous voltage levels of the voltage source signal; and
    (iii) the period of the switch control signal trends directly with the line voltage level of the time-varying voltage source signal.

17. The method of claim 13 wherein determining a period of the switch control signal comprises determining a period of the switch control signal so that the period of the switch control signal:
    (i) trends inversely to estimated power delivered to a load coupled to the switching power converter;
    (ii) trends inversely to instantaneous voltage levels of the voltage source signal; and
    (iii) trends directly with the line voltage level of the time-varying voltage source signal.

18. The method of claim 13 wherein determining a period of a switch control signal further comprises determining a period of a switch control signal so that the trend of the period of the switch with respect to instantaneous voltage levels of the voltage source signal is linear.

19. The method of claim 13 wherein determining a period of a switch control signal further comprises determining a period of a switch control signal so that the trend of the period of the switch with respect to instantaneous voltage levels of the voltage source signal is non-linear.

20. The method of claim 13 wherein determining a period of a switch control signal further comprises determining a period of a switch control signal so that the trend of the period of the switch with respect to instantaneous voltage levels of the voltage source signal is based on a piece-wise linear step function.

21. The method of claim 13 wherein the switching power converter includes an inductor coupled between an input and an output of the switching power converter, the method further comprising:
transferring power to the inductor when the switch conducts; and
transferring power to the output of the switching power converter when the switch is nonconductive.

22. The method of claim 13 further comprising:
determining multiple periods of the switch control signal during each 180 degree half-cycle of the time-varying voltage source signal so that less than 50% of the cycles of the switch control signal occur when a magnitude of the time varying voltage source signal is less than a root mean square of the time varying voltage source signal.

23. The method of claim 13 further comprising:
  detecting a voltage level value of the time-varying voltage source signal; and
  determining the period of the switch control signal comprises determining the period of the switch control signal in accordance with the detected voltage level.

24. The method of claim 13 wherein the line voltage level of the time-varying voltage source signal is represented as one of the members of a group consisting of: a root mean square value, an average value, and a peak value of the time-varying voltage source signal.

25. The method of claim 13 wherein determining a period of the switch control signal further comprises determining a period of the switch control signal so that a maximum period of the switch control signal differs from a minimum period of the switch control signal by a ratio of at least 2:1.

26. An apparatus comprising:
  means for generating a switch control signal to control conductivity of a switch included in a switching power converter, wherein controlling conductivity of the switch causes an input current to the switching power converter to vary in approximate proportion to a time varying voltage source signal supplied to the switching power converter;
  means for determining a period of the switch control signal so that the period of the switch control signal varies in accordance with at least one of:
    (i) the period of the switch control signal trends inversely to instantaneous power transferred to the switching power converter;
    (ii) the period of the switch control signal trends inversely to voltage level changes of the voltage source signal; and
    (iii) the period of the switch control signal trends directly with a line voltage level of the time-varying voltage source signal; and
  means for determining a pulse width of the switch control signal in response to at least one of: (i) the determined period of the switch control signal, (ii) a voltage level of the voltage source signal, and (iii) a voltage level of the output voltage signal of the switching power converter.

* * * * *